United States Patent [19]

Dunkel

[11] Patent Number: 5,572,125
[45] Date of Patent: *Nov. 5, 1996

[54] CORRECTION AND AUTOMATED ANALYSIS OF SPECTRAL AND IMAGING DATA

[76] Inventor: Reinhard Dunkel, 470 S. 1300 East, #1004, Salt Lake City, Utah 84102

[*] Notice: The term of this patent shall not extend beyond the expiration date of Pat. No. 5,218,299.

[21] Appl. No.: 471,726

[22] Filed: Jun. 6, 1995

Related U.S. Application Data

[63] Continuation-in-part of Ser. No. 73,337, Jun. 7, 1993, which is a continuation-in-part of Ser. No. 675,401, Mar. 25, 1991, Pat. No. 5,218,299.

[51] Int. Cl.$^6$ .............................. G01V 3/00; G01V 3/14
[52] U.S. Cl. ............................................ 324/307; 324/309
[58] Field of Search .................................. 324/300, 307, 324/309

[56] References Cited

U.S. PATENT DOCUMENTS 5,218,299   7/1993   Dunkel ................................. 324/307

OTHER PUBLICATIONS

Article by K. Derby, et al., "Baseline Deconvolution, Phase Correction, and Signal Quantification in Fourier Localized Spectroscopic Imaging", published in *Magnetic Resonance in Medicine*, Nov., 1989, pp. 235–240.
Ernst, Journal of Magnetic Resonance, 1969, 1, 7.
Montigny et al., Analytical Chemistry, 1990, 62, 864.
Siegel, Analytica Chimica Acta, 1981, 133, 103.
Daubenfeld et al., Journal of Magnetic Resonance, 1985, 62, 195.
Brown et al., Journal of Magnetic Resonance, 1989, 85, 15.
van Vaals and van Gerwen, Journal of Magnetic Resonance, 1990, 86, 127.
Sotak et al., Journal of Magnetic Resonance, 1984, 57, 453.
Herring, F., G., Philips, P. S. Journal of Magnetic Resonance, 1984, 59, 489.
Craig, E. C., Marshall, A. G., Journal of Magnetic Resonance, 1988, 76, 458.
Cieslar et al., Journal of Magnetic Resonance, 1988, 79, 154.
Chmurny and Hoult, Concepts in Magnetic Resonance, 1990, 2, 131.
Ernst, The Review of Scientific Instruments, 1968, 39 (7), 988.
Craig and Marshall, Journal of Magnetic Resonance, 1986, 68, 283.
Dunkel et al., Journal of Magnetic Resonance, 1990, 90, 290–302.
Marshall and Verdun, Fourier Transforms in NMR, Optical, and Mass Spectrometry, 1990, 279–330.

*Primary Examiner*—Sandra L. O'Shea
*Assistant Examiner*—Mack Haynes
*Attorney, Agent, or Firm*—Mallinckrodt & Mallinckrodt

[57] ABSTRACT

Using regression analysis, n-dimensional spectral and imaging data from sources including Nuclear Magnetic Resonance or Electron Spin Resonance spectrometers, can be automatically analyzed and the data acquisition equipment or the data itself can be corrected for various determined types of distortion. The method allows correction of, for example, signal drift, sample saturation, removal of phase, baseline and shim distortions and allows removal of unwanted signals from the data. From ratios of determined parameter and error values signals can be distinguished from noise-related responses and using Monte Carlo simulations the corresponding signal detection probabilities can be derived. With the model of an n-dimensional signal, a parametric description of the dataset can be obtained with parameter and error values which truly reflect signal overlap and mutual parameter correlations. From this parametric description higher-level interpretations of the data, such as spin systems and related signal patterns, can be derived efficiently.

29 Claims, 22 Drawing Sheets

| LINE SHAPE | ABSORPTION $A(\omega)$ | DISPERSION $D(\omega)$ |
|---|---|---|
| LORENTZIAN | $\dfrac{\tau}{1+(\omega-\omega_o)^2\tau^2}$ | $\dfrac{(\omega-\omega_o)\tau^2}{1+(\omega-\omega_o)^2\tau^2}$ |
| SINC | $\dfrac{\sin[(\omega-\omega_o)T]}{\omega-\omega_o}$ | $\dfrac{1-\cos[(\omega-\omega_o)T]}{\omega-\omega_o}$ |
| LORENTZIAN CONVOLUTED WITH SINC FUNCTION | $\dfrac{\tau}{1+(\omega-\omega_o)^2\tau^2}[1+\exp(-T/\tau)\times$ $\{(\omega-\omega_o)\tau\sin[(\omega-\omega_o)T]-\cos[(\omega-\omega_o)T]\}]$ | $\dfrac{\tau}{1+(\omega-\omega_o)^2\tau^2}[(\omega-\omega_o)\tau-\exp(-T/\tau)\times$ $\{(\omega-\omega_o)\tau\cos[(\omega-\omega_o)T]+\sin[(\omega-\omega_o)T]\}]$ |
| GAUSSIAN | $\dfrac{1}{\sqrt{2\pi}\sigma}\exp\left(-\dfrac{(\omega-\omega_o)^2}{2\sigma^2}\right)$ | $-\dfrac{1}{\pi}\int_{-\infty}^{\infty}\dfrac{A(\varpi)}{\omega-\varpi}d\varpi$ |
| LORENTZIAN LINES WITH GAUSSIAN DISTRIBUTION OF PEAK POSITIONS | $\dfrac{1}{2\pi\sigma}\int_{-\infty}^{\infty}\dfrac{\tau}{1+(\omega-\omega_o+\Delta)^2\tau^2}\exp\left(-\dfrac{\Delta^2}{2\sigma^2}\right)d\Delta$ | $\dfrac{1}{2\pi\sigma}\int_{-\infty}^{\infty}\dfrac{(\omega-\omega_o+\Delta)\tau^2}{1+(\omega-\omega_o+\Delta)^2\tau^2}\exp\left(-\dfrac{\Delta^2}{2\sigma^2}\right)d\Delta$ |

*Fig. 2.*

Chemical Shift [ppm]

Chemical Shift [ppm]

| | | |
|---|---|---|
| A | GET COMPLETE SPECTRUM OR SPECTRAL REGION | $\vec{G}$ |
| B | CALCULATE BASELINE FUNCTION FROM BASELINE PARAMETERS | $\vec{B} = f(b_0,...,b_n)$, e.g. Eq. 9 |
| C | SUBTRACT BASELINE FUNCTION FROM SPECTRUM | $\vec{G} = \vec{G} - \vec{B}$ |
| D | CALCULATE PHASE FUNCTION FROM PHASE PARAMETERS | $\Phi'(\omega) = \sum_{j=0}^{m} \Phi_j \omega^j$, Eq. 3 |
| E | APPLY PHASE FUNCTION TO THE SPECTRUM | $\vec{F} = \vec{G}\, e^{i\Phi'(\omega)}$, Eq. 4 |
| F | CALCULATE DESIGN MATRIX FROM PREDETERMINED LINE SHAPE FUNCTION AND LINE SHAPE PARAMETERS | A, e.g. Eq. 8<br>Functions: Fig.2 & Eq.6 |
| G | SOLVE SET OF LINEAR EQUATIONS FOR INTENSITIES E.G. REAL-VALUED INTENSITIES IN A LEAST-SQUARES SENSE | $\mathbf{A} \times \vec{I} = \vec{F}$, Eq. 7<br>$\vec{I} = (\mathbf{A}^T \mathbf{A})^{-1} \mathbf{A}^T \times \vec{F}$ |
| H | PENALIZE UNFAVORABLE DETERMINED INTENSITY VALUES E.G. SET NEGATIVE INTENSITIES TO ZERO | $\vec{I}' = f'(\vec{I})$ |
| I | SIMULATE THE SPECTRUM | $\vec{F}_{sim} = \mathbf{A} \times \vec{I}'$ |
| J | DETERMINE SPECTRUM OF RESIDUALS | $\vec{R} = \vec{F} - \vec{F}_{sim}$ |

Fig. 14.

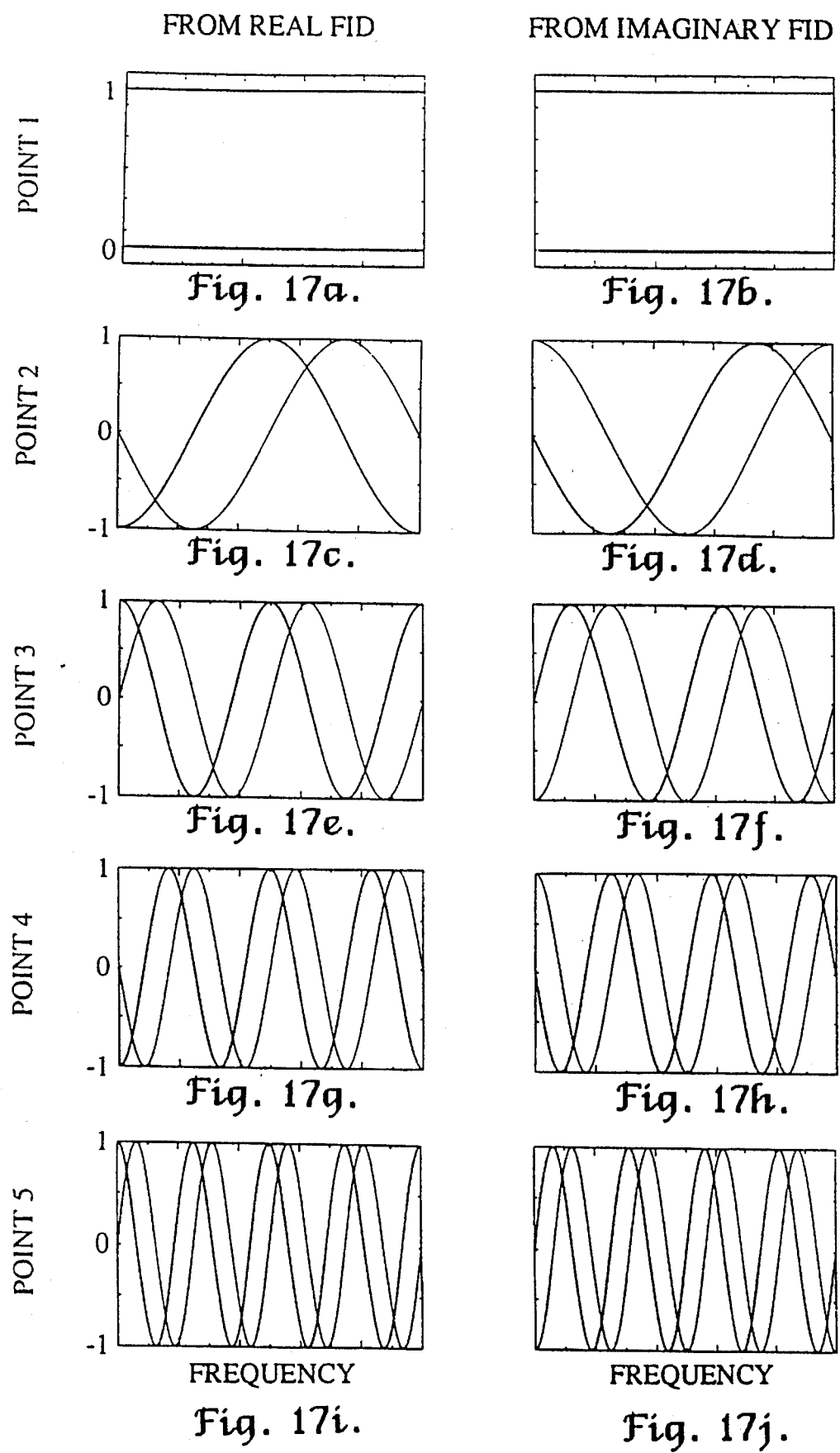

CORRECTION AND AUTOMATED ANALYSIS OF SPECTRAL AND IMAGING DATA

RELATED APPLICATIONS

This is a continuation-in-part of my co-pending U.S. application Ser. No. 08/073,337 (filed Jun. 7, 1993) a continuation-in-part of my former U.S. application Ser. No. 07/675,401 (filed Mar. 25, 1991). Of these, U.S. application Ser. No. 07/675,401 has issued as U.S. Pat. No. 5,218,299.

BACKGROUND OF THE INVENTION

1. Field

The invention is in the field of the automated analysis and correction of n-dimensional spectral data, such as spectral or imaging data obtained through nuclear magnetic resonance, electron spin resonance, ion cyclotron mass spectrometry, infrared spectrometry, etc.; where n is greater than or equal to 1.

2. State of the Art

A Nuclear Magnetic Resonance (NMR) Spectrometer subjects a sample to a magnetic field, stimulates the sample with an electromagnetic pulse, and measures the responses of the sample. Such a device comprises a magnet to generate a magnetic field, a source of pulsed electromagnetic energy, and a sensor for monitoring the response of a sample subjected to both the magnetic field and to the pulsed electromagnetic energy. An introduction to the principles of NMR spectrometry appears in Chapter 8 of Alan G. Marshall and Francis R. Verdun, *Fourier Transforms in NMR, Optical, and Mass Spectrometry, A User's Handbook*, Elsevier, 1990. An Electron Spin Resonance (ESR) spectrometer is structurally similar.

An Ion Cyclotron Resonance (ICR) Mass Spectrometer also comprises a magnet for generating a magnetic field, a source of electromagnetic energy, and a sensor for monitoring the response of a sample to the electromagnetic energy. The sample for ICR consists of charged particles, usually molecules, in a vacuum. An introduction to ICR appears in Chapter 7 of Marshall and Verdun (id.)

Infrared and visible spectrometers subject a sample to a beam of electromagnetic energy, and have a detector to measure the energy transmitted through or modified by the sample. The frequency response of the sample may be obtained by subjecting the sample to a scanned frequency source, or by using a broadband source with a scanning interferometer. The essentials of modern infrared and visible transmission spectrometers are described in Chapter 9 of Marshall and Verdun (id.).

Various methods are used to obtain spectral or imaging data for a variety of purposes. The data obtained may be collected in the time or frequency domain. Collected data can be converted between the time and frequency domain by sampling and digitizing a time domain signal and using a digital computing device to perform a Fourier Transform (FT). Data are usually obtained by perturbing an object to be studied and measuring the response from the object. For example, in nuclear magnetic resonance (NMR), an object is subjected to magnetic fields varying in both time and space. In the case of magnetic resonance imaging (MRI), the spatial variation of the fields is of crucial importance in spatially selecting portions of the sample for measurement. In the case of both imaging and spectroscopy, pulses of radio or microwave frequency (RF) electromagnetic energy are applied to cause a resonance phenomenon. Detectors measure the magnetic fluctuation in the object under study and provide data that are evaluated to determine various characteristics of the object. These magnetic fluctuations are oscillatory, and the frequency, phase, relaxation time and amplitude of the oscillations carry information about the sample. Because of various characteristics of the instrumentation, signal properties such as frequencies, phases, line-shapes, and amplitudes may be distorted and in addition may change over extended periods of time. In order to obtain maximum information from the data, the data must either be corrected to remove these instrumental artifacts or be automatically analyzed in a way insensitive to these distortions.

Many spectrometers do not directly digitize the signal obtained by detecting the response of the sample because of the limited bandwidth of available Analog to Digital Converters (ADC's). These spectrometers mix the detected signal with the output of a local oscillator to heterodyne the signal to a lower frequency range in the same manner that a conventional superheterodyne radio receiver shifts signals into its Intermediate Frequency range. In NMR, the local oscillator is known as the "transmitter", and the frequency at which it operates is known as the "transmitter offset."

To stabilize the position of signals, various hardware solutions to lock the field/frequency ratio are in routine use as described in Derek Shaw *Fourier Transform N. M. R. Spectroscopy* (second edition); Elsevier: Amsterdam, 1984; p. 142ff. Most spectrometers use heteronuclear locking on a lock substance added to the sample, typically keeping the position of one deuterium resonance constant while observing other nuclei such as $^1$H or $^{13}$C. Homonuclear locking is used in some continuous wave (c.w.) proton spectrometers. With homonuclear locking, frequently a small amount of a substance is added to the sample for locking purposes, such as tetramethylsiloxane (TMS), containing the same nucleus as the nucleus being observed, but having a local molecular environment such that it produces an easily recognizable resonance. The prior art uses the frequency value corresponding to the experimental signal from the additive to determine the needed correction. Spectra may also be taken without feedback control of the instrument, but the resulting spectra must generally be interpreted with reference to the position of a similar reference signal. Further, if spectra are to be averaged for noise reduction, the spectra must be corrected for frequency drift of the instrument, known as positional shifts.

Addition of an additive chosen to provide a recognizable locking signal is undesirable because this technique requires that the sample be polluted with the additive. The additive might modify the sample characteristics and there may be an overlap between the signal obtained from the additive and the desired signal from the sample being tested.

Sample saturation results from applying on the average more energy to the sample than the sample can dissipate. The generally used method to detect signal saturation is to increase the excitation power and to see whether or not the sample response increases as expected for an unsaturated sample. The inventor is not aware of prior art for the automatic determination of sample saturation through monitoring determined signal parameters nor of an automated way to control sample saturation.

The most common method currently in use to phase correct spectral data is to manually adjust coefficients of a phase correction function until the experimental data exhibit expected visual properties as observed by a spectroscopist. The extent of correction that can be accomplished manually is limited, and the outcome is subject to the biases of the spectroscopist. With most steps of the data collection and processing being automated, manual phasing is a weak link in the process.

Where frequency domain data are used, such data are generally obtained from time domain data through Fourier transformation. Modern spectrometers and imaging devices use quadrature detection and a complex Fourier transform of the acquired data yields a complex spectrum, i.e., a spectrum consisting of a real and an imaginary part. Ideally, the real part of such a spectrum would contain pure absorption mode responses and the imaginary part would contain pure dispersion mode responses. However, a mismatch between reference and detector reference phase introduces frequency-independent phase shifts, while delays between excitation and acquisition, frequency sweep excitation, and delays introduced by electronic filtering produce a frequency dependent mixture of both modes. For higher-dimensional spectra there is a similar problem associated with each dimension, thus manual correction of multidimensional spectra can become extremely tedious or even impossible.

Methods to avoid phase correction by processing and displaying the information in a phase independent way are in frequent use. However, such methods reduce the information content of the data and for most purposes phase sensitive data are preferable.

A pure absorption mode spectrum can be obtained from phase sensitive data by properly mixing real and imaginary parts at every point in the spectrum, a process called phase correction. The pure absorption mode yields data with the best resolution and sensitivity. Also aliased peaks can be identified by their anomalous phases, a detection which is not possible for phase insensitive spectra. In addition, positive and negative intensities can be distinguished and, if the spectra are taken carefully, the area under an absorption mode signal is proportional to the number of nuclei generating the signal.

A properly phased complex one-dimensional (1D) spectrum can be written as $$F(\omega)=A(\omega)+i\,D(\omega) \qquad [1]$$

wherein the real portion of the spectrum, $\mathrm{Re}[F(\omega)]=A(\omega)$, contains the absorption mode signals, and the imaginary portion of the spectrum, $\mathrm{Im}[F(107)]=D(107)$, the dispersion mode signals. In such equations, the angular frequency, $\omega$, has units of radians and is related to the frequency, $\mathrm{U}$ by $\mathrm{U}=\omega/(2\pi)$. An experimental spectrum, $G(\omega)$ can show frequency-independent and frequency-dependent phase shifts and is related to the well-phased spectrum $F(\omega)$ by the phase function, $\phi(\omega)$, as follows:

$$G(\omega)=F(\omega)\,e^{-\phi(\omega)} \qquad [2]$$

Another notation in frequent use employs the opposite sign in the exponent and thereby shifts the phase angles by $\pi$. The relative phase shift between real and imaginary spectra would be $-\pi/2$ instead of $\pi/2$. Phase correction attempts to estimate $F(\omega)$ from the observed $G(\omega)$, typically by determining an approximate phase function $\phi'(\omega)$. Often, for two or more test signals in the spectrum $G(\omega)$, coefficients of the phase connection function are adjusted manually so that the corrected phase angle at the transition frequency of each of the chosen lines looks optimally adjusted. Underdigitized spectra always appear to be somewhat poorly phased due to the sinc character of the observed lineshape, making it desirable to use more objective criteria for phase adjustment.

Since signal phases are generally a slowly varying continuous function of the resonance frequency, a best-fit polynomial can be used to interpolate the phases of the test lines so as to correct every point in the spectrum. Phases in 1D spectra can only be determined within a multiple of $2\pi$. In higher-dimensional spectra a simultaneous phase shift in two orthogonal directions of $\pi$ does not change the appearance of the spectrum and in either case, optimum phases for the test resonances might need to be shifted by $2\pi$ or $\pi$ before interpolation. The first two terms of a power series, the zero$^{th}$ and first order corrections $\phi_0$, and $\phi_1$, $\phi$respectively, in:

$$\phi'(\omega)=\phi_0+\phi_1\omega+\phi_2\omega^2+. \qquad [3]$$

are often sufficient to achieve a satisfactory phase adjustment. This approach of "frequency-dependent" phase shifts is the only widely used method but it is not an accurate way of phase correcting a spectrum. In reality, spectra are a sum of lines, each with its own frequency-independent phase. The phase angle of a signal tail is determined not by its position in the spectrum, but by the phase angle at the signal's transition frequency. The use of the approximate low-order phase function for phase correction of the spectrum $G(\omega)$ according to $$F(\omega)=G(\omega)\,e^{i\phi'(\omega)} \qquad [4]$$

modifies the lineshape of the signals by the frequency-dependent phase shift of this equation and introduces baseline undulations.

Typically, "difficult" 1D spectra and some 2D spectra are phased manually using the experience of a trained spectroscopist. In higher-dimensional spectra and in imaging applications, "phase-independent" methods are currently often used because the amount of data involved are too large for manual phasing.

Several methods have been proposed for the automated phase correction of 1D spectra. Ernst published the first article on autophasing methods in the *Journal of Magnetic Resonance* 1969, 1, 7. The first method described by Ernst calculates the zero$^{th}$ order phase angle $\phi_o$ with the following relationship:

$$\phi_o = \arctan\left(\frac{I_g}{I_r}\right) \qquad [5]$$

where $I_q$ is the integral of the imaginary part of the entire spectrum and $I_r$, is the corresponding integral of the real spectrum. The calculated angle, $\phi_o$, is then used to phase correct the data. By replacing the integrals by amplitudes in Eq. 5, Montigny et al., in a method described in *Analytical Chemistry* 1990, 62, 864, determine the phases for individual points in the spectrum near the signal maximum. These determined phases are then used to correct the data. The second method described by Ernst is based on the ratio of maximum to minimum signal excursion. This ratio becomes infinite for pure absorption mode signals and it is unity for a dispersion mode signal. Ernst applied phase corrections to the spectrum to maximize this ratio by an iterative procedure. When the ratio is maximized, the data are supposedly phased. Using a Simplex algorithm, Siegel, in a method described in *Analytica Chimica Acta,* 1981, 133, 103, used the maximization of signal height and the minimization of the area below the baseline as criteria for optimization. Daubenfeld et al., as described in the *Journal of Magnetic Resonance* 1985, 62, 195, looked at both Ernst's second method criteria and Siegel's criteria and used an interpolation between spectral points with a Lorentzian lineshape model to improve the optimization based on the criteria of maximum peak area, maximum signal height, and a new criterion, minimum remaining phase deviation, i.e., phase angle. If any one of these criteria are met, the data are assumed to be correctly phased by Daubenfeld's method.

Brown et al. *Journal of Magnetic Resonance* 1989, 85, 15, used the criteria of flat baseline and narrow linewidth at the base of the signal for phasing. Maximization of the number of spectral points inside a small region of amplitudes defined by the noise level around a flat baseline will yield phased spectra with signals in positive or negative absorption. Van Vaals and van Gerwen *Journal of Magnetic Resonance* 1990, 86, 127, proposed to determine the best spectral phasing by iteratively recalculating a crude spectral model with varying phase distortions, determining the phase function from the model and fitting this function to the phase function of the measured spectrum over both ends of the spectrum remote from the transition frequencies of lines of in vivo NMR spectra.

A plot of dispersion vs. absorption mode (DISPA), as described in Sotak et al. *Journal of Magnetic Resonance* 1984, 57, 453, Herring, F. G.; Phillips, P. S. *Journal of Magnetic Resonance* 1984, 59, 489, and Craig, E. C.; Marshall, A. G. *Journal of Magnetic Resonance* 1988, 76, 458, initially used to analyze lineshapes, allows one to determine the phase of an isolated Lorentzian line. If a Lorentzian line is misphased, the DISPA plot will show a circle with diameter equal to the absorption mode peak height rotated around the origin by the number of degrees equal to the phase misadjustment.

Two-dimensional NMR is a well known technique, and is described in Section 8.5 of Alan G. Marshall and Francis R. Verdun, *Fourier Transforms in NMR, Optical, and Mass Spectrometry, A User's Handbook*, Elsevier, 1990.

For the automated phase correction of symmetrical two-dimensional (2D) NMR spectra with absorptive in-phase diagonal (e.g., NOESY, HOHAHA, z-COSY), Cieslar et al., in *Journal of Magnetic Resonance* 1988, 79, 154, proposed to maximize the sum of diagonal elements and subsequently to minimize the asymmetry of the diagonal peaks. For 2D spectra with dispersive (e.g., COSY) or absorptive-antiphase diagonal (e.g., DQF-COSY, E. COSY), the reverse must be carried out.

As long as the experimental spectrum has no baseline distortions, infinite signal-to-noise ratio (S/N), infinite digital resolution, and only isolated lines with Lorentzian lineshapes, most methods described will produce a fairly well phased spectrum.

In real spectra, baseline distortions can be caused by several mechanisms and can hardly be avoided. Especially critical are instrumental artifacts like pulse breakthrough and probe ringing that distort the first few points in the FID and cause broad baseline distortions after FT. Long signal averaging times for dilute samples, strong and perhaps incompletely suppressed signals such as solvent lines, aliased dispersive tails of strong signals and unresolved broad resonances are further reasons for baseline distortions. None of the autophasing methods described so far is tolerant concerning these distortions. Especially sensitive are all methods based on integrals and van Vaal's method of determining phases from distant signals by fitting the phase function of a model to both ends of the phase function of the spectrum.

A method capable of phasing spectra at low S/N and low resolution will have to use all the information available concerning the signal phase. Methods based on only a few points around the signal maximum such as DISPA, maximum signal height, and ratio of maximum to minimum signal excursion neglect the phase information in the rest of a signal. Brown's method is limited to the phase information of the baseline and neglects the information of points at the signal maximum.

DISPA plots require at least three points with high S/N around the signal maximum and these points should have magnitudes above 60% of the magnitude maximum. This requires a rather well digitized spectrum. A typical carbon spectrum with linewidths of 0.2 Hz and a spectral width of 200 ppm acquired on a 500 MHz instrument would require a digitization of $2^{18} \approx 260,000$ complex points, which is significantly higher than normally used for 1D spectra. This might be one of the reasons that Brown found this method to be "extremely unreliable for phasing typical $^1$H and $^{13}$C spectra". Similar problems can be expected for all methods involving peak heights unless an interpolation with a lineshape model is involved.

All methods are sensitive to signal overlap. In particular, the maximum of the spectral area doesn't correspond to a well-phased spectrum in the case of signal overlap.

Van Vaals, in U.S. Pat. No. 4,876,507, described a method involving the steps of:

(1) determining peak locations (e.g., for DISPA plots) from a modulus or power spectrum, (2) correcting overlapping peaks by means of the peak parameters determined, and (3) using a polynomial as a frequency-dependent phase function determined by a least-squares criterion to determine an overall phase function.

The determination of peak locations from a power spectrum has been shown by Herring and Phillips *Journal of Magnetic Resonance* 1984, 59, 495, and, using a best-fit polynomial as a phase function has been described by Daubenfeld et al. *Journal of Magnetic Resonance* 1985, 62, 200, and by Craig and Marshall *Journal of Magnetic Resonance* 1988, 76, 461.

The Van Vaals patented method, as well as the other known methods described, while providing some measure of phase correction, leave much room for improvement in phase correction methods and results.

Much of the equipment used for obtaining the experimental data relies on a uniform magnetic field or linear magnetic field gradient during excitation of the object to be investigated. Any departure from these standards creates distortions which degrade resolution and signal-to-noise ratio of the data and are very difficult to correct after the data have been acquired. With such distortions it may be difficult or impossible to obtain desired information from the signal. To avoid such distortions, in equipment such as nuclear magnetic resonance equipment, it is important that the magnetic field distortions over the sample volume be as small as possible. Improvements in field uniformity can be made by using additional magnetic fields produced by as many as 38 shim coils placed inside the main magnetic field. Such apparatus is shown in U.S. Pat. No. 3,569,823 as applied to superconducting solenoids and in U.S. Pat. No. 3,622,869 as applied to permanent magnets and electromagnets. The electrical current through these coils may be adjusted to cancel the inhomogeneity of the main magnet, a process called shimming. The application of the invention to magnet shimming is described in U.S. Pat. No. 5,218,299. Other shimming methods are described in U.S. Pat. Nos. 4,987,371 and 5,006,804.

A variety of methods have been proposed for the suppression of solvent signals as described by Tsang et al. in *Journal of Magnetic Resonance* 1990, 88, 210–215. The proposed methods use experimental signal suppression or correct acquired data through digital filtering techniques or subtraction of a dispersive signal tail function.

For the automated analysis of spectral or imaging data, a criterion to distinguish genuine signals from noise related responses is needed.

Posener, D. W. in *Journal of Magnetic Resonance* 1974, 14, 121 used parameter precisions to derive equations describing the dependence of the signal detection on the signal lineshape and the spectral S/N ratio. Marshall and Verdun in *Fourier Transforms in NMR, Optical, and Mass Spectrometry. A User's Handbook*; Elsevier: Amsterdam, 1990; Chapter 5 used parameter precisions to determine the precision of determined peak positions, widths, and heights as a function of peak shape using Monte Carlo type simulations. No applications of various ratios of parameter and corresponding error value (e.g., parameter precisions) for the distinction of genuine signals from noise related responses or for the determination of signal detection probabilities have been used.

Previous methods aimed at using computer-assisted or automated techniques to analyze nD spectral or imaging data have consisted mainly of the application of direct techniques such as cluster analysis and peak picking (Glaser, S.; Kalbitzer, H. R. *Journal of Magnetic Resonance* 1987, 74, 450 and Meier, B. U.; Madi, Z. L.; Ernst, R. R. *Journal of Magnetic Resonance* 1987, 74, 565, linear prediction or maximum entropy methods (Gesmar, H.; Led, J. J. *Journal of Magnetic Resonance* 1989, 83, 53), or least-squares parameter optimization (Madi, Z. L.; Ernst, R. R. *Journal of Magnetic Resonance* 1988, 79, 513) in cases of severe overlap and/or strong coupling.

SUMMARY OF THE INVENTION

Multidimensional experimental spectral or imaging data can be automatically analyzed or can be automatically corrected for various data distortions using the invention. In both aspects of the invention, a mathematical model defining the expected experimental spectral or imaging data is selected or determined. The model includes various parameters to be adjusted to best fit the data. Initial estimates of the parameters are made, and such estimates of the parameters are inserted into the mathematical model of the expected spectral or imaging data. Regression analysis is performed using the mathematical model with appropriate estimated parameters during which such estimated parameters are adjusted so that the values of the parameters providing the best-fit of the mathematical model to the actual data are obtained. The adjusted parameters obtained through this regression analysis may be used to correct the data and provide corrected data to be analyzed in traditional manner by a spectroscopist, or the adjusted parameters may be used directly to provide the desired information regarding the data. This is referred to as automatically analyzing the data.

Especially for the automated data analysis, it is desired to determine whether or not these final best-fit parameter values describe a genuine signal and hence provide useful information. When analyzing the data automatically, in addition to obtaining the parameters, an error value for at least one of the parameters, and preferably all of the parameters, is obtained. From the ratio of a determined parameter value to its error value it can be determined whether a signal is present in the data as opposed to data merely containing noise.

The mathematical model used will depend upon the data to be corrected and the information desired to be extracted from the data. The preselected parameters to be initially estimated will depend upon the model used. In the simplest cases, where the data to be corrected or analyzed is expected to consist of a plurality of separate, single, substantially homogeneous signals, the expected shape of such signals after correction is usually known and can be described mathematically as a known function such as a Lorentzian, Gaussian, sinc function, or convolutions thereof. Thus, the mathematical model used to define the experimental spectral data will define such data as a combination of the absorption mode and dispersion mode components of the expected corrected shapes to calculate a resultant signal as close as possible to the experimental data. If some of the signals in the experimental data are made up of overlapping signals, the single line model will not work well to describe such signals. If the overlapping signals are made up of two or more substantially homogeneous signals which overlap and display distinct maxima for each of the overlapping signals, an overlap model can be used to analyze such signals to take into account the overlap of the component signals. Finally, if a signal is substantially broadened without discernible maxima for essentially all of the component signals, as is usually the case with imaging data, such signals can be modeled using a more complex mathematical model which decomposes the signal into many overlapping signals. Such a decomposition model can be used to describe virtually all signals, whether a heterogeneously broadened signal or merely one or more single signals. Such models may be used for determining a wide variety of parameters, such as distortion parameters, scaling parameters, position parameters, and lineshape parameters.

Data corrections which can be derived from these determined parameters include the suppression of selected spectral signals, locking, phasing, baseline correction, determination/control of sample saturation and needed homogeneity adjustments of the magnetic field. These determined parameters, if extracted in real time, are particularly useful for performing the required frequency or magnetic field strength adjustments for locking a spectrometer to the desired resonances. These determined parameters may also be used for correcting the spectra for the frequency shift of the instrument, thereby avoiding the necessity of polluting the sample with a reference nucleus for conventional instrument locking. Phase parameters may be easily determined from the data using the above-mentioned models and those determined phase values can be used to correct the data or adjust the instrument, and phase parameters and phase correction will be used hereafter as an example for the use of the invention.

Where data containing more than one signal are to be corrected, such as with most spectral data, the preselected parameters will be estimated for each of a plurality of signals present in the data, and preferably for each of the signals identifiable in the data, and a regression analysis is performed separately for each of the signals to obtain adjusted estimated parameters for each signal. These adjusted parameters are then used to phase correct the data and, since adjusted parameters are used for each identifiable signal in the data, very good phase correction is obtained over the entire frequency range of the data. Phase corrected data can be simply determined by using the adjusted phase parameters and error values for each signal to obtain an overall phase correction function for the data. The phase correction function is then applied to the experimental data to obtain the phase corrected data.

Alternatively, the phase corrected data can be calculated from the mathematical model using the best-fit parameter values with the phase parameters set to zero. This provides phase corrected simulated data which represent the phase corrected experimental data, but without the noise. However, various other information may be missing from the calculated data depending upon whether all signals were identified and included in the regression analysis. A preferred method for obtaining the phase corrected data when a number of separately identifiable signals are present in the data includes the calculation through regression analysis of the adjusted parameters as described. The adjusted parameters provide a best-fit of the mathematical model to the data. These calculated data are subtracted from the experimental data to be corrected. This leaves the residuals which include any signals that were not originally identified, or, for some other reason, for which parameters were not estimated and then adjusted, along with baseline distortion, distortions caused by an inhomogeneous magnetic field during the data acquisition, noise, and distortion signals resulting from the usual less than perfect fit. Using the adjusted phase parameters for each signal, a phase correction function is obtained. The phase correction function is applied to the residual data to provide phase corrected residuals. The adjusted parameters are used with the phase parameters set to zero to calculate, using the mathematical model, the phase corrected calculated spectrum. The phase corrected residuals are then added to the phase corrected calculated data to obtain the final composite corrected data. The final data corrected in this manner include all signals in the original data as well as any contribution due to missed signals, baseline distortion, and noise, but eliminate the distortions resulting from the identified signals for which calculated data are used. Thus, the corrected data include all information of the original data but has eliminated the most severe distortions.

It is preferred with the invention that once the initial regression analysis is performed for each of the initially identified signals, that those initially identified signals which are actually a cluster of separately identifiable overlapping signals be identified. These signals can usually be identified as those for which a good fit to the single line model was not obtained. However, other methods of identifying such clusters of signals may be used such as identifying signals which are closer together than a set fraction of the signal widths. Using the adjusted parameters for the overlapping signal clusters from the single line model as initial estimates, regression analysis is performed for these identified clusters of overlapping signals using an overlap mathematical model. The parameters are further adjusted through regression analysis for best-fit of the overlapping signal clusters and those further adjusted parameters are used in conjunction with the parameters determined for the non-overlapping signals in determining a phase correction function. In the alternate methods of correction described, the further adjusted parameters for the signal clusters are used to calculate and phase correct the data.

In instances where the data contain one or more bands made up of many overlapping, unresolved signals, the signal can be referred to as a heterogeneously broadened signal made up of a plurality of overlapping homogeneous signals which are not resolved into individual homogeneous signals. Such an unresolved band will occur occasionally in high resolution spectral data, but is frequently encountered in solid state or imaging data. In fact imaging data may contain only a single such spectral feature. Mathematical models representing the expected substantially homogeneous signals, or sets of overlapping separately identifiable signals as described above, cannot adequately describe the signal made up of many unresolved overlapping signals. In such a case, the mathematical model used in the invention to represent the data consists of a predefined decomposition of the heterogeneous signal into many homogeneous signals. This decomposition model is defined using a set of equations. The expected signal height at each location within the heterogeneous signal due to the superposition of all homogeneous signals at that location is equated to the actual measured height in the experimental data of the heterogeneous signal at that location. These equations include both linear and nonlinear parameters. By estimating the nonlinear parameters and keeping them constant in the equations, the equations become linear. The equations are then solved for the linear parameters which represent the intensity of each of the overlapping signals at their resonance frequencies within the band to provide the best overall solution of the equations with the fixed nonlinear parameters. Regression analysis is performed using the set of equations and adjusting at least some of the nonlinear parameters until the best-fit is obtained. These parameters are then used to phase correct the data. In such instances, it is preferred to use the adjusted phase parameters to determine a phase correction function and then to apply the function to the data to phase correct it.

Instead of the corrected experimental spectrum, it is sometimes desirable to use the deconvoluted spectrum represented by the best-fit linear model parameters that describe the intensity of the signal having its transition frequency at each location within the heterogeneous band. The resulting calculated signal eliminates the smearing effect created by the linewidth of the individual signals and provides an image of higher contrast, or, with spectral data, a higher spectral resolution.

Any data, spectral or imaging, and made up of any number of heterogeneous or substantially homogeneous signals, may be defined by the decomposition model which treats the data to be corrected as a plurality of overlapping homogeneous signals. However, because the decomposition model uses a set of equations which has to be solved for each adjustment of the nonlinear parameters during the regression analysis, the evaluation of such a mathematical model is compute intensive. Therefore, where the data can be defined and corrected using the single line and/or the overlap model, use of these simpler models is preferred because less computer time is required to provide the adjusted parameters and the corrected data. However, if the set of equations used in the decomposition model is implemented in special purpose hardware, it could easily be applied to all data to be corrected.

As indicated, in many cases, it will be desirable to correct the data for baseline distortion. It is preferred that the mathematical models used to define the signals include parameters defining the baseline contribution to the signal shapes. These parameters are then adjusted during the regression analysis and the adjusted parameters may be used to determine an overall baseline correction function. This baseline correction function preferably includes both real and imaginary parts which are applied separately to the real and imaginary portions of the experimental data before combination of such signals to provide phase correction. Alternatively, baseline correction can be obtained if baseline parameters are not included in the mathematical model by subtracting the calculated data from the experimental data to obtain the residual data as previously described. Using the residual data, which generally clearly show the baseline distortion, a baseline distortion correction function can be determined. This correction function can be applied to the residual data to correct for the baseline distortion before adding the residual data to the calculated data, can be applied to the composite sum of calculated and residual data, or can be applied directly to the experimental data to correct for baseline distortion.

The first step in the correction of various data distortions is the determination of a parametric description of the data using regression analysis. The obtained parametric description contains both the information about data distortions as well as the information needed to automatically analyze the data. The informational part of the parametric data description consists of the number of identified data signals as well as a numerical description for each signal. For a one-dimensional spectrum such a description could consist of the amplitude, position and lineshape of each signal. For the analysis of higher-dimensional data, a signal will generally be described by an overall amplitude and by a position and lineshape parameter for each data dimension.

The kind of experimental signal to be detected is determined by the model equation. Only data signals of a shape similar to the model will lead to well-defined best-fit parameter values. The invention describes the use of one or more ratios of determined parameter values and respective error values to derive signal detection probabilities. A possible such ratio would be the parameter precision defined as the parameter value divided by its error value. Neither parameter values nor error values by themselves are invariant to the overall scaling of the imaging or spectroscopic data to be analyzed. Evaluation of the distribution of one or more chosen ratios in a Monte Carlo simulation or for signal and non-signal experimental spectral regions allows derivation of probabilities of the presence of a distinct signal shape. An important application is the determination of signal detection probabilities for noisy data.

The obtained parametric description of all identified signals represents the information contained in the data. In the case of n-dimensional spectral data, spectroscopists are normally not interested in individual signals, but in groups of signals. These groups of signals could, for example, represent a system of coupling nuclear spins. If the data to be analyzed can contain a variety of possible spin systems or other signal patterns of interest it is not practicable to use multi-line models to determine the kinds of signal patterns present in the data. From the determined parametric data description such groups of signals can efficiently be determined using state-of-the-art database technology by retrieving sets of signals satisfying given constraints.

A sample in NMR and ESR spectrometry becomes saturated when the sample absorbs so much energy from the applied RF source that no further RF energy at the resonance frequency will be absorbed. The sample will recover equilibrium with an exponential time constant T1. It has been found that T1 can be determined using the method to extract intensity parameters for the same resonance on at least two spectra taken at different times following a sample saturating pulse. This information may be fed back to the instrument to control the rate at which data is taken.

DRAWINGS

The best modes presently contemplated for carrying out the invention in actual practice are illustrated in the accompanying drawings, in which:

FIG. 1 is a graphic illustration of the construction of a signal in a unphased simulated spectrum as a sum of absorption, dispersion, and baseline components;

FIG. 2, a collection of absorption and dispersion mode formulas defining the most symmetric lineshapes encountered in spectroscopy;

FIG. 3, a phase angle vs. frequency diagram showing a hypothetical phase function;

FIG. 4, a phase angle vs. frequency diagram the phase angles of three signals in a hypothetical spectrum;

FIG. 5, a phase angle vs. frequency diagram showing removal of phase ambiguities by shifting phase angles 44 and 45 of FIG. 4 by $\pm 2\pi$;

FIG. 6, a phase angle vs. frequency diagram with the linear interpolation 46 of the left phase angle 43 and the middle phase angle 44 of FIG. 5, followed by a $2\pi$ phase shift of the remaining phase angle 45;

FIG. 7, a phase angle vs. frequency diagram with the linear interpolation 47 of the middle phase angle 44 and the right phase angle 45 of FIG. 5, followed by a linear reinterpolation 48 of all three phase angles;

FIG. 8, a Nassi-Shneiderman diagram of an autophasing method following the invention;

FIG. 9, a proton-decoupled $^{13}$C-NMR spectrum of 8mg cholesterol with phase and baseline distractions;

FIG. 10, the spectrum of FIG. 9 after phase and baseline correction performed according to an embodiment of the invention, including expansions of various spectral regions;

FIG. 11, a diagram of determined phase and baseline parameter values vs. chemical shift frequency for the spectrum of FIG. 9;

FIGS. 12a through 12d, diagrams showing several overlapping signals in the real and imaginary spectral regions before and after a phase correction using an overlap model;

FIGS. 13a through 13d, graphic illustrations of the decomposition of a complex valued signal into a set of overlapping lineshapes with and without a phase difference between signal and basis functions;

FIG. 14, a Nassi-Shneiderman diagram of a response function for the decomposition model;

FIG. 15, a $^{23}$Na-NMR spectrum of a $Na_2MoO_4$ powder sample with phase and baseline distortions;

FIG. 16, the spectrum of FIG. 15 after phase and baseline correction performed according to an embodiment of the invention;

FIGS. 17a through 17j, graphic illustrations of distortions created in the real (17a, 17c, 17e, 17g, and 17i) and imaginary (17b, 17d, 17f, 17h, and 17j) spectra due to changes in amplitude of the first five points in the free induction decay (FID);

FIGS. 18a through 18f, a three-dimensional representation of, from top to bottom, the experimental, (18a and 18b) simulated,(18c and 18d) and residual (18e and 18f) bond region of a two-dimensional Incredible Natural Abundance Double Quantum Transfer Experiment (INADEQUATE) spectrum before phase correction;

FIG. 19, a diagram of phase angle vs. chemical shift frequency for the phase angles in shift direction determined for all peak doublets of bond regions in the spectrum of 1,1-dimethyltetralin which includes both phase angles in horizontal direction of left and right windows in FIG. 18;

FIG. 20, a diagram of phase angle vs. double quantum frequency for the phase angles in double quantum direction determined for all bond regions in the spectrum of 1,1-dimethyltetralin which includes the phase angle for the bond region shown in FIG. 18;

FIGS. 21a through 21f, a three-dimensional representation of, from top to bottom, the experimental,(21a and b), simulated,(21c and d) and residual (21e and 21f) bond region of the spectrum in FIGS. 18a through 18f after phase correction indicated by FIG. 19 for the shift direction and FIG. 20 for the double quantum direction;

FIG. 22, a diagram similar to that of FIG. 19 but for an 8 mg. cholesterol sample;

FIG. 23, a diagram similar to that of FIG. 20 but for the 8 mg. cholesterol sample used for FIG. 22;

FIGS. 24a through 24d, a three-dimensional representation of a spectral region in a two-dimensional Incredible Natural Abundance Double Quantum Transfer Experiment (INADEQUATE) spectrum showing, from top to bottom, a simulated bond signal with added normally distributed noise to obtain an RMS signal-to-noise ratio of five (24a and 24b) and the simulated bond signal without added noise (24c and 24d);

FIG. 25, a probability vs. intensity parameter precision diagram illustrating the Monte Carlo determination of signal detection probabilities showing distribution 52 of precisions determined from one thousand simulated noise containing spectral datasets as shown in FIG. 24 and the bimodal distribution 50 and 51 of precisions from one thousand analyzed noise-only spectral regions;

FIG. 26, a decomposition diagram of the automated analysis program for n-dimensional spectra showing the top-level modules of the software;

FIG. 27, a plot of bond intensity precisions for noise and for actual bonds as recognized from a 2D INADEQUATE NMR spectrum; and FIGS. 28a and 28b, a 2D DQF-COSY spectrum of conotoxin as acquired (28a) and as processed (28b) by the present invention.

DETAILED DESCRIPTION OF THE ILLUSTRATED EMBODIMENTS

Figure 1:
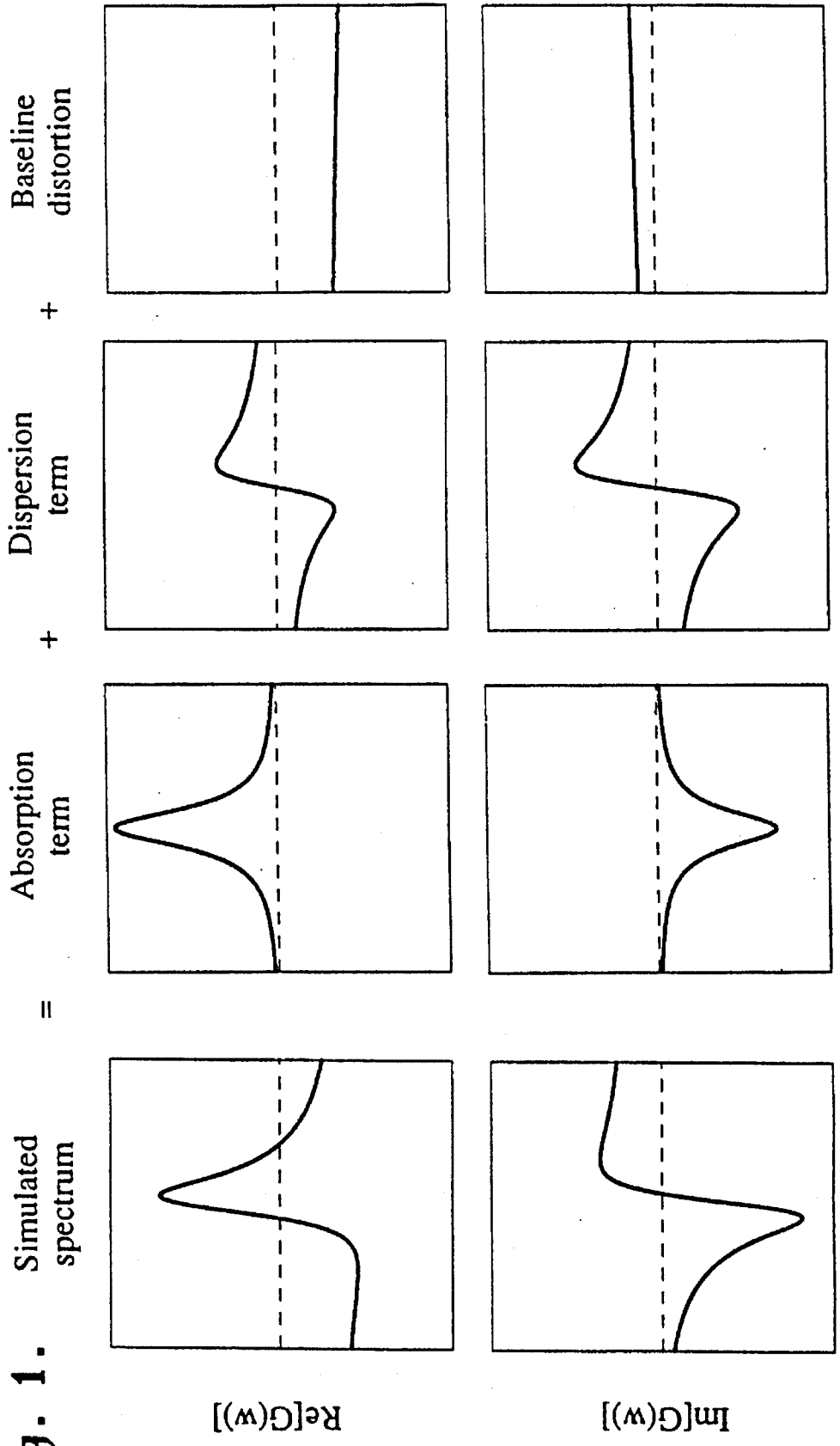

While the invention may be practiced in several different specific embodiments, and such embodiments and their applications will be described separately, all embodiments are directed to or include the step of correcting or automatically analyzing experimental spectral or imaging data. Most experimental data will contain signals which should have essentially known shapes, or are made up of a plurality of signals of essentially known shapes. By constructing a mathematical model which describes the expected shape of the signals within the data, the model parameters can be adjusted through regression analysis to provide a best-fit of the model to the data. If a proper model has been chosen, the model should match well the experimental data and the parameter values determined at that best-fit provide the information to properly correct and analyze the experimental data.

The details of the invention will be described with respect to several different models that may be used in connection with different types of data and in connection with use of the invention for the purpose of correcting or analyzing experimental data. The initial discussion of the invention which follows is directed to phase correction of experimental data, but provides the general framework for other types of correction also.

Regression analysis in conjunction with response surface mapping allows exhaustive searching of multi-dimensional data to find signals. The computational overhead of regression analysis makes it often worthwhile to predetermine possible signal regions for full analysis. This can be done by performing regression analysis on subdimensional data first to derive possible signal containing spectral areas in the multidimensional data and then performing the regression analysis only on the derived regions of multidimensional data. Alternatively, by using less demanding analysis approaches first or for multidimensional data through the analysis of lower dimensional data, possible signal containing spectral areas can be identified and regression analysis is only used for the careful analysis of such data regions.

For one-dimensional spectra such a predetermination can be done from a power or magnitude spectrum. Besides approximate transition frequencies of possible lines, rough estimates of other characteristic parameters such as intensities and linewidths can also be determined. The accuracy of obtained values is limited by signal distortions caused by signal overlap and phase parameters cannot be obtained from phase insensitive power or magnitude spectra. In addition to the techniques used for one-dimensional spectra, possible signal regions in multi-dimensional spectra can be derived from related one-dimensional spectra or from various projections of the multi-dimensional data.

The initial comparison of a phase sensitive spectrum and the lineshape model will show strong deviations due to inaccurately determined lineshape parameters and the unknown spectral phase. These deviations, measured as the sum-of-squared residuals, can be decreased by either adjusting the phase of the spectrum to fit the model or by adjusting model parameters to fit the data. In contrast to prior art, which iteratively improves the phase of a single resonance by changing the spectrum to optimize a predefined criterion, it is preferable, with the present invention, to keep the data unchanged while all data distortions such as the phase are included in the model and adjusted with the other parameters to best describe the spectral region.

This approach makes the well-developed methods of regression analysis applicable to spectral correction and automated data analysis. An error analysis for every parameter allows the assessment of the goodness-of-fit, proper weighing of determined values, determination of parameter correlations, and in relationship with the parameters the distinction (and distinction probabilities) between signals and noise.

The model can be constructed so that the phase parameter specifies which combination of absorption and dispersion mode describes the real and imaginary spectrum best. The equation for the possibly unphased simulated spectral data $G(\omega)$ can be derived from Eq. 2:

$$G(\omega) = F(\omega)e^{-i\emptyset(\omega)} = [A(\omega) + i\, D(\omega)](\cos \emptyset - i \sin \emptyset) \quad [6]$$

$$Re[G(\omega)] = A(\omega)\cos \emptyset + D(\omega)\sin \emptyset$$

$$\begin{aligned} Im[G(\omega)] &= -A(\omega)\sin \emptyset + D(\omega)\cos \emptyset \\ &= A(\omega)\cos(\emptyset + \pi/2) + D(\omega)\sin(\emptyset + \pi/2) \end{aligned}$$

Baseline distortions and the influence of partly overlapping signals can be approximated by a term which is linear with respect to frequency in the vicinity of the transition frequency of the signal under consideration. This linear term can be incorporated into Eq. 6 to eliminate the influence of baseline distortion and partially overlapping signals on the other parameter values. FIG. 1 shows the construction of the unphased simulated spectrum $G(\omega)$ as a sum of the absorption terms, $A(\omega)\cos \phi$ and $-A(\omega)\sin \phi$, the dispersion terms, $D(\omega)\sin \phi$ and $D(\omega)\cos \phi$, and the linear baseline distortion terms $b_0 + b_1 (\omega-\omega)$ and $b_0'(\omega-\omega_0)$ for an isolated line in both the real and the imaginary data sets. The fitting process of this model to a spectral region can be viewed as the determination of the best decomposition of the signal into these three components. The parameters of the absorption and dispersion terms provide the information needed for phase correction and the linear baseline terms provide the information for the correction of the baseline.

To avoid the removal of the tail of a strong resonance, zero order baseline parameters, $b_0$ and $b_0'$, should be used for interpolation only for those regions whose corresponding first order terms are sufficiently small. Note that it is not necessary that a signal be detected in order to use the determined baseline parameters, as long as the fitting process converged.

The model will not generally be able to completely explain the signal power in a spectral region. The power in the simulated spectrum typically will be smaller than the power in the experimental spectrum, and equal to the spectral power only in the case of a perfect fit. Residuals, defined as the difference between the spectrum and its model, are normally random and are caused by noise in the spectrum. The approximate standard errors in the parameters can be used to assess the influence of random residuals on the parameter values. Only signals whose determined parameter precisions, i.e., the ratio of the parameter value to its uncertainty, have at least a chosen significance for all free parameters in the model should be considered valid signals. Non random residuals indicate a bad approximation of the observed signal by the lineshape model, which, in many cases, will be due to the presence of severe signal overlap.

The choice of an appropriate lineshape model consisting of absorption mode, $A(\omega)$, and dispersion mode, $D(\omega)$, functions depends on the spectrum under consideration. In high resolution NMR, this shape will almost always be of a Lorentzian type, characteristic of damped oscillatory motion. FIG. 2 contains formulas of symmetrical lineshape models satisfactory for use with the method of the invention, and several other satisfactory formulas can be found in the book by Marshall and Verdun entitled *Fourier Transforms in NMR, Optical, and Mass Spectrometry*; Elsevier: Amsterdam, 1990. In the formulas of FIG. 2, the absolute value of $(\omega-\omega)$ is the distance from the resonance frequency and $\sigma$ is the width of a Gaussian line or Gaussian distribution of resonance frequencies.

The pure Lorentzian lineshape requires a time-domain observation, where the transverse relaxation time $\tau$ is short compared to the acquisition time T. Particularly in higher-dimensional spectroscopy, where digital resolution is severely limited due to the amount of available storage or available time for data acquisition, the opposite is frequently found, producing essentially sinc-shaped lines. The intermediate case, the Lorentzian lineshape convoluted with a sinc function is probably the most useful model in the current context.

Gaussian lines can arise in spectroscopy directly, but are more frequently generated using weighting functions. The absorption mode Gaussian can be expressed in closed form while the calculation of the dispersion mode requires one of the numerical methods described by Wang and Marshall in *Analytical Chemistry* 1983, 55, 2348. The given dispersion mode formula, known as the Hilbert transform, is a mathematical relationship which allows one to convert between absorption and dispersion mode signals.

Inhomogeneous broadening of lines is found when normally equivalent spins in the sample resonate at different frequencies due to such effects as magnet inhomogeneity or temperature and concentration gradients. The Gaussian distribution of Lorentzian lines of different position, known as the Voigt function, can be found in NMR spectra of polymers or adsorbed species. The absorption and dispersion mode of the Gaussian distribution can be normalized by dividing by the absorption peak height at the resonance frequency. The evaluation of both functions requires a numerical integration.

Even unsymmetrical signals can be phased in this way as long as a parametric model can be derived describing the pure absorption lineshape. The invention will always produce, in a least-squares sense, the phase corrected spectrum with lineshapes in the real spectrum as close to the specified absorption part of the model as possible. Even in cases of significant deviations between assumptions (model) and spectrum, the signal decomposition into basis functions will produce an approximate solution and an assessment of the quality of the fit. Complete failures encountered with other autophasing systems are highly unlikely as long as the postulated lineshape bears a reasonable resemblance to the observed one.

Spectral lineshapes are influenced only by the sine and cosine of the phase angle and hence the phase of a signal or group of signals can only be determined within $2\pi$ and might need to be shifted before interpolation by a phase function. The number of possible combinations of such shifts for n determined phase angles increases exponentially with n and exploration of all possibilities becomes prohibitive for any significant number of phases.

In NMR, the delay-time between excitation and detection is typically in the order of half of one analog-to-digital converter dwell period. The resulting linear phase shift usually creates less than one $\pi$ of phase variation across the spectrum. Only a few spectroscopic methods cause phase shifts of more than $2\pi$ across the spectrum ("phase wrapping").

A method has been developed as a part of the invention for correction of an essentially linear phase distortion over a spectral width not to exceed n $\pi$ across such spectral width, where n is typically, but not limited to, two. The computational requirements increase only linearly with the number of phases and the method provides an efficient means to shift and interpolate phase values.

Figure 3:
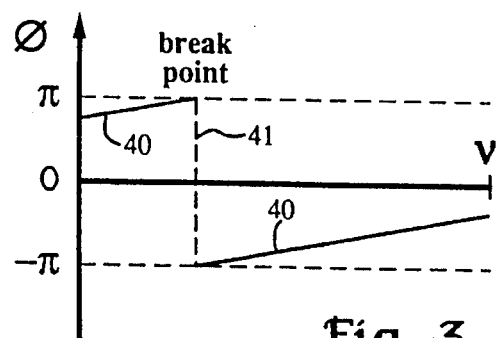

The method involves two main steps. First, the ambiguity in the determined phases is removed by shifting all phases into a minimal phase range. In FIG. 3 the range of $-\pi<\phi\leq\pi$ was chosen to remove the uncertainty caused by possible $2\pi$ phase shifts. Since phase angles are assumed to change linearly with resonance frequency, all determined phases will lie (in the absence of measurement errors) on the straight sloped line 40 shown in FIG. 3. This line can have one (and only one) break point for a maximum allowed phase shift of $2\pi$ across the spectrum. The break point is shown by the vertical broken line 41 in FIG. 3, and phase values on either side of the break point can have phase differences of up to $2\pi$.

The second step of the method eliminates the break point in the phase function. For three or more determined phase angles, a determined frequency/phase pair with equal, or approximately equal, number of phases at lower and higher resonance frequencies is chosen as the "midpoint". Three situations can occur:

1. The break point is on the left side of the midpoint.
2. The break point is on the right side of the midpoint.
3. No break point exists between the determined phases.

In situation 1, interpolation of the phase of the midpoint and all phases on the right side of the midpoint will yield the correct linear phase correction function. In situation 2, the interpolation of midpoint phase and all phases on the left side of the midpoint gives the correct result. Both situations can be distinguished by shifting those phases that were initially not included in the interpolation as close to the determined line as possible by phase changes of ±2π. In both cases, the interpolation is repeated including shifted and unshifted phases. The linear function which satisfies the constraint of the maximum phase shift across the spectral width or, in case both do, the one with the smallest weighted sum-of-squares is the best linear phase function. In situation 3, where there is no break point between the determined phases, the two determined lines for situations 1 and 2 are identical and no special treatment of this situation is necessary.

Figure 4:
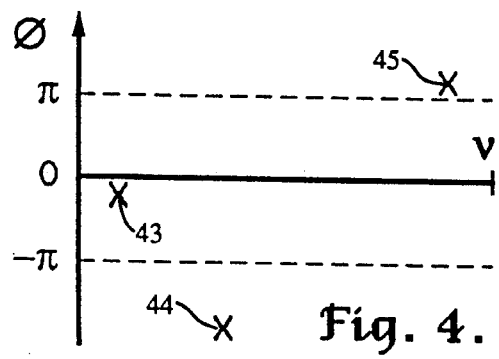
Figure 5:
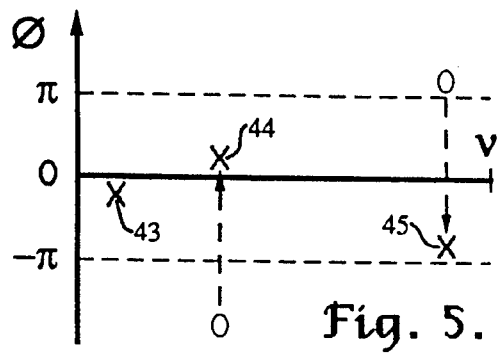
Figure 6:
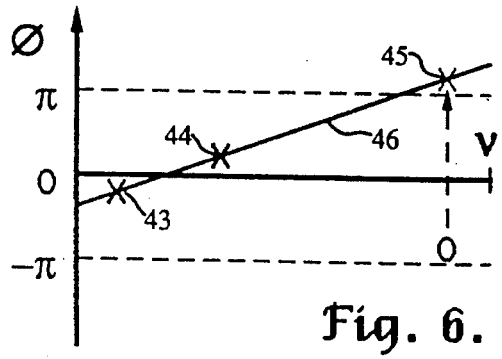
Figure 7:
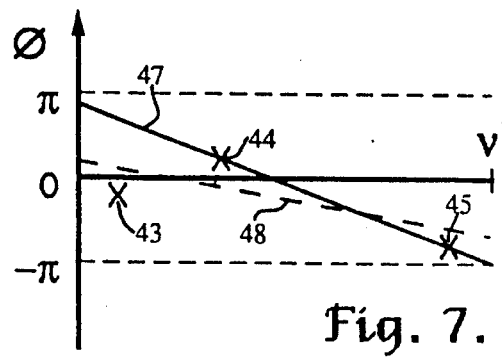

FIG. 4 shows an example of three determined phase angles from a hypothetical spectrum. The two phases 44 and 45 are outside of the ±π range so according to the method, need to be shifted inside the chosen spectral range of $-\pi < \phi \leq \pi$. As shown in FIG. 5, the determined phase angle 44 is shifted by +2π into the desired range while the determined phase angle 45 is shifted by −2π into the desired range. Phase angles 43 and 44 from FIG. 5 are then interpolated with the interpolation represented by line 46, FIG. 6, and the right hand phase 45 in FIG. 5 is shifted by 2π to a position as close to the line as possible. Reinterpolation of the three phases 43, 44, and 45 does not change the phase function represented by the original interpolation shown by line 46. Returning to FIG. 5, interpolation of the determined phases 44 and 45 is represented by line 47 in FIG. 7. Phase angle 43 is not close to the line and shifting by 2π does not bring phase angle 43 closer to line 47. Thus, an interpolation of the three phase angles 43, 44, and 45 is made and represented by the broken line 48. However, the fit of this phase function to the phase angles is worse than the fit obtained in FIG. 6 and since both lines satisfy the requirement of a maximum phase shift of 2π across the spectrum, the best possible phase function is the one from FIG. 6.

For a maximum phase change of 4π across the spectral width, shifting of phases in the range of $-\pi < \phi \leq \pi$ can produce up to two break points and three spectral regions have to be interpolated separately to determine the best phase function. Extension to higher phase shifts across the spectrum is possible, but limited by the number of determined phases and their accuracy. If the source of extensive phase shifts is known, such as time delays before data acquisition, an approximate phase correction should be calculated and applied to the determined phases before further phase corrections are determined.

In another preferred embodiment of the invention, phase shifts around the break points for phases are minimized by determining a window within which the extracted phase shifts will approximate a straight line. For example, when the extracted phase shifts are near 0, a window of from +π to −π is used. When the expected phase shifts are close to π, a window of, for example, −π/2 to +π/2 is used. In this way, the apparent discontinuity in the linear phase function at plus or minus π can be eliminated.

In spectra where signals can be in positive and negative absorption, a phase value determined to be $\phi = \pi/2$ could correspond to a positive absorption signal ($\phi = 0$) or a negative absorption signal ($\phi = \pi$) with a phase distortion of plus or minus π/2. Hence, phases have to be shifted initially in a range of π (e.g., $-\pi/2 < \phi \leq \pi/2$) to remove ambiguities. For an allowed phase change across the spectrum up to 2π, two break points can occur between phase values and three interpolations have to be determined as previously discussed. Signals in the corrected spectrum are in positive and/or negative absorption with dispersion components removed, but an uncertainty of ±π for the zero$^{th}$ order phase remains, which is an ambiguity inherent in the spectrum and not a characteristic of the algorithm.

The extension of the method to higher-dimensional spectra is slightly complicated by "coupled" phase shifts of ±π in two orthogonal directions of the spectrum which compensate each other in their effects.

In experimental spectra with low S/N ratios, it is advantageous to include as many phases of identified signals in the analysis as possible, weighted in the interpolation by the determined standard deviations of these values. In the case of a strong correlation between determined zero$^{th}$ and first order phase corrections it will normally be advantageous to determine and report only the best zero$^{th}$ order correction.

Finally, there might not exist an overall phase function for all signals in a spectrum. Examples from NMR spectroscopy are spectra with partly suppressed (solvent) signals which show random phase or aliased lines ("ghosts") that exhibit the phase characteristic of their true position which lies outside the detected frequency range. The identification of such problems can be achieved by a goodness-of-fit test for the best-fit weighted linear phase function. In such cases there does not exist a simple phase correction function for all signals in the spectrum. If only a minority of signals exhibit phase anomalies, outlier tests can be used to identify these signals and they can be excluded from the determination of a phase correction function. Generally, it will be desirable to provide some kind of indication when signals have been excluded to alert the spectroscopist of possible data or equipment problems.

If the overlap of signals gets so severe that resonances are only barely resolved, the determined parameters will deviate appreciably from the true lineshape parameters. On average, these deviations cancel for symmetric patterns and tend to cancel for unsymmetrical patterns if the number of lines is sufficient. However, the suggestion in U.S. Pat. No. 4,876,507, to Van Vaals that "an excessive contribution to a line can be subtracted from a neighboring line" assuming a Lorentzian model and using parameter values determined from a magnitude spectrum is inexact. Unfortunately, lines always influence each other and parameters of one line used to correct other lines are incorrect for the very same reason.

Overcrowded regions can be identified by the parameter values determined for all signals in the spectrum. Since phase sensitive spectra contain a true superposition of lines, a model consisting of a sum of lines can be used to fit the overcrowded spectral region. Starting values are now the best-fit values of the preceding fit which assumed isolated lines. All overlap is included in the model and will not influence the determined parameter values. The final values can also be used to calculate accurate integrals of signals in case of severe signal overlap.

For the distortion-free phase correction of a spectrum, the complete knowledge of all signals with associated line parameters is essential. However, even with partial deviation of the simulated from the experimental spectrum, distortions caused by frequency-dependent phase functions for signals identified and sufficiently characterized during the regression analysis can be avoided. From the best-fit parameter values of all resonances, a reasonably accurate unphased spectrum can be simulated. Distortionless phase correction of these simulated data is as easy as recalculation of the simulated spectrum with phase parameters set to zero. The spectrum of residuals, calculated as unphased experimental minus unphased simulated spectrum, can be phased in the traditional way using an overall phase polynomial as described above. The phase corrected experimental spectrum is the sum of phased residuals plus the simulated spectrum with phase parameters set to zero. The intermediate spectrum of residuals also provides an excellent data set for determination and correction of baseline distortions.

Figure 8:
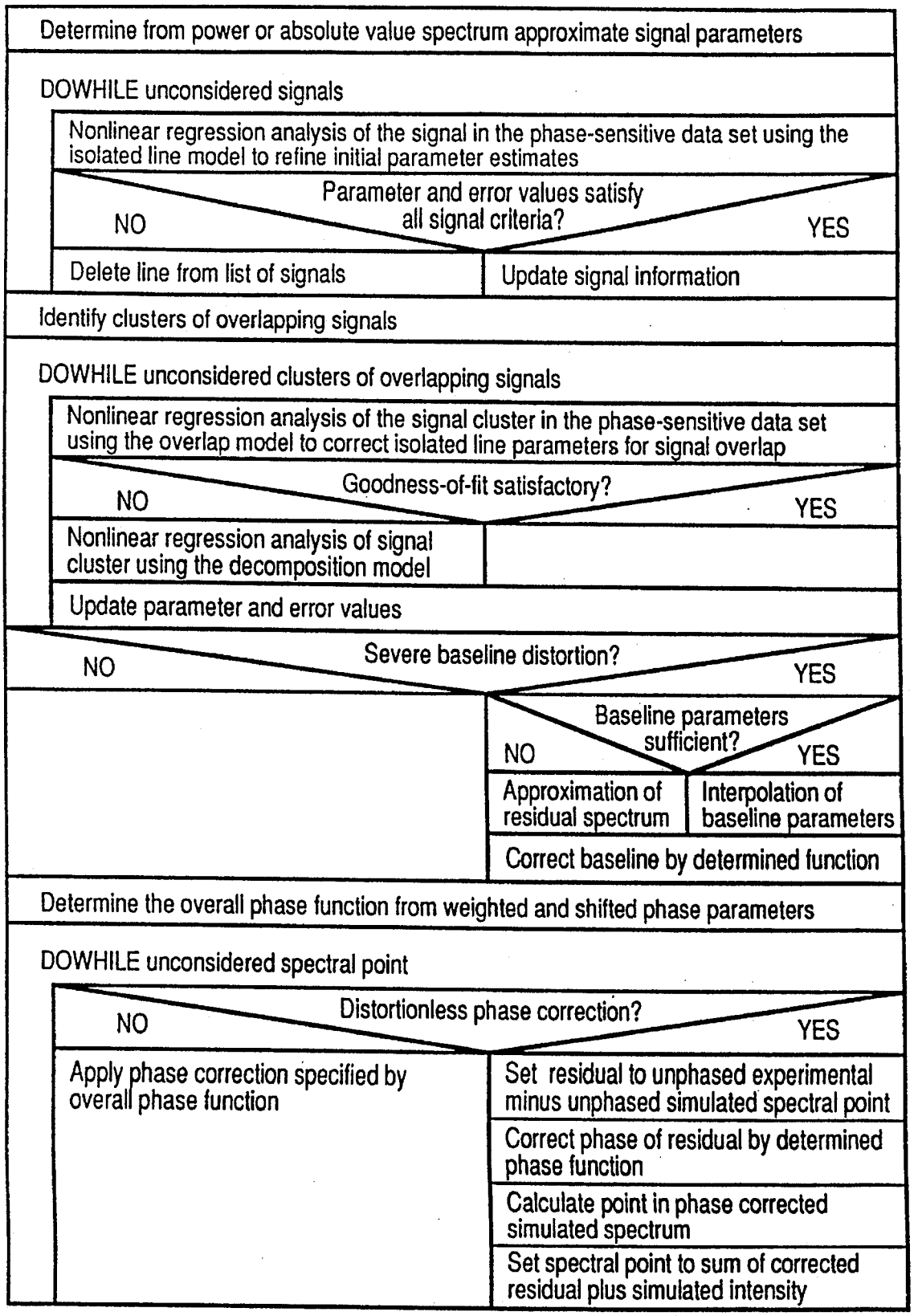

The Nassi-Shneiderman diagram of FIG. 8 summarizes the program flow of an autophasing method for one-dimensional frequency domain data in accordance with the invention. As indicated by the diagram, the initial step of the program is to determine from a power or absolute value spectrum approximate signal parameters. This is done for each signal that can be identified in the spectrum.

For each identified signal, a nonlinear regression analysis of the signal is performed using the initially determined parameters as estimates and adjusting the parameters until the best-fit of the model to the signal data is obtained. The model used in this step is the single line model. This operation is indicated in the diagram as "Nonlinear regression analysis of the signal in the phase sensitive data set using the isolated line model to refine initial parameter estimates". When a best-fit of the model to the data is obtained for a signal, an error analysis is performed to, for example using parameter precisions, determine how good the fit actually is. This is indicated as "Parameter and error values satisfy all signal criteria? "If the goodness-of-fit is within preset criteria, the program advances through the "YES"branch to "Update signal information", meaning that the adjusted parameters determined are saved to be used in phasing and otherwise correcting the data. If the goodness-of-fit is not within the preset criteria, the program proceeds through the "NO" branch to discard information about that particular signal. When the criteria are not met, this generally means that the identified signal is not a valid signal.

This analysis works as a loop and is repeated as long as there are identified signals in the data which have not undergone the regression analysis.

When all identified signals have undergone regression analysis, a determination is made as to whether there are clusters of overlapping signals which need further analysis using an overlap model. This step is indicated by "Identify clusters of overlapping signals."A cluster of overlapping signals may generally be determined by finding that the fit of the model to the data is not very good, or by evaluating closeness of signal peaks and comparing it to signal width. If no clusters of overlapping signals are identified, the next loop operation is skipped and the program moves to the "Severe baseline distortion? "determination. If clusters of overlapping signals are identified, the program moves to a regression analysis of such overlapping signals using an overlap model. This is indicated by "Nonlinear regression analysis of the signal cluster in the phase-sensitive data set using the overlap model to correct isolated line parameters for signal overlap." During the regression analysis on a cluster of overlapping signals, the overlap model is fitted to the cluster of signals. When the best-fit of the model to the data is obtained, the "Goodness-of-fit" is evaluated and if satisfactory, the program progresses through the "YES-"branch and updates the parameter values using the parameters calculated with the overlap model. If the "Goodness-of-fit" is not satisfactory, the program progresses through the "NO" branch to perform a "Nonlinear regression analysis of signal cluster using the decomposition model." Thus, if the signal is not satisfactorily defined by the overlap model, the signal is evaluated using the universal decomposition model for fitting the signal. While this is a universal model, it is usually more complex from a calculational standpoint and takes more computer time to solve. Thus, in this embodiment of the program, it is used as a last resort for signals which cannot be defined satisfactorily by the single line or overlap models. After evaluation using the decomposition model, the adjusted parameter resulting from the analysis are updated and stored.

When all clusters of overlapping signals have been evaluated, the program moves to determine if severe baseline distortion is present. If it is not, the program moves through the "NO" branch to the step of "Determine the overall phase function from weighted and shifted phase parameters." This involves using the various parameters determined and adjusted by prior steps to determine the overall phase function for the data. If severe baseline distortion is present, the program determines if the information from baseline parameters is sufficient to perform such correction. If "YES", an interpolation of the existing baseline parameters is made to provide a baseline correction function, and the baseline is corrected. If the existing baseline parameters are not satisfactory, a correction for the baseline through an "Approximation of residual spectrum" is determined and then the baseline is corrected. With the baseline corrected, the program moves to "Determine overall phase function from weighted and shifted phase parameters."

The program then determines if it has been set to merely phase correct the data by application of the phase function to the data, or if a distortionless phase correction is desired. If only phase correction is desired, the program progresses through "NO" and applies the determined phase function to the data to provide phase corrected data. However, while such phase correction is the equivalent of the correction currently done by a spectroscopist, it produces a phase corrected signal generally better than can be produced manually or with currently available equipment, merely applying the phase function to the data results in the introduction of some baseline and signal shape distortion. In many cases it is desirably to not add this distortion. If distortionless phase correction is desired, the program moves through the "YES" branch to provide phase correction without additional distortion.

For the phase correction provided by the YES branch, the program first determines the unphased residual spectrum by subtracting the unphased simulated or modeled spectrum from the experimental spectrum. This residual spectrum includes the signals, noise, or other data not considered in the modeled calculated spectrum. The residual spectrum is then corrected using the determined phase function. The phase corrected simulated spectrum is then calculated. This is generally done by setting the phase parameters in the model to zero. This produces a calculated spectrum without addition of distortion. If all signals in the spectrum had been identified and utilized in the model fitting process, the calculated spectrum is an accurate phase corrected and distortionless representation of the data. However, because the system is not perfect and some signal information from the data may not have been considered by the model, in order to preserve and not lose such information it is preferred that the calculated spectrum and the corrected residual spectrum are then added to provide the final output corrected spectrum. This spectrum has been corrected for phase without introduction of additional distortions caused by the signals taken into account by the model, but information remaining in the residual spectrum is retained by adding such residual spectrum back to the calculated spectrum.

The above program which progresses from single line model to overlap model to decomposition model is usually used only with one-dimensional spectra. With multidimensional spectra, use of the single line and the overlap model is usually satisfactory. N-dimensional spectra consist of $2^n$ phase quadrants for the complete phase sensitive data and the data set is normally called "hyper-complex". The States-Haberkorn-Ruben method, see *Journal of Magnetic Resonance* 1982, 48, 286, can be used for mixing intermediate data sets during the n-dimensional Fourier transform to achieve phase sensitive spectra that can be phased to obtain pure absorption mode lineshapes, when this is possible at all. The theoretical n-dimensional lineshape is just a product of n 1D functions and can be efficiently calculated during the nonlinear regression analysis. For every dimension one normally needs three additional parameters, namely a transition frequency, a phase angle, and a linewidth. The number of parameters increases linearly with increasing dimensionality, while the number of points with significant information increases multiplicatively. For every additional dimension the number of phase sensitive data sets doubles and the number of points in any of these data sets increases by a factor equal to the number of points in the new direction. This tremendous increase in information about a signal results in an increased accuracy of the determined parameters. In addition, the signals are spread into several dimensions, thereby dramatically decreasing the risk of overlap and associated problems necessitating the use of the decomposition model.

Example Phase and Baseline Correction of a 1D Spectrum Using Single Line Model

Figure 9:
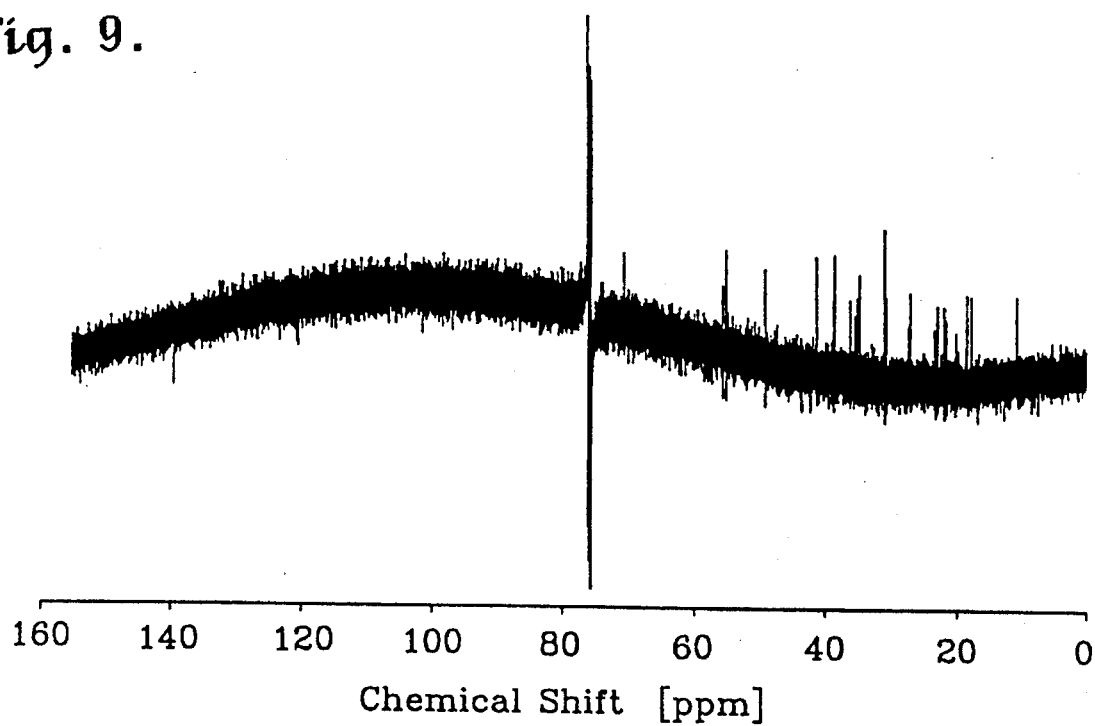

One-dimensional $^{13}$C NMR spectra are particularly well-suited for testing autophasing systems since both the S/N ratio and digital resolution are often low due to the 1.1% natural abundance of $^{13}$C and due to the wide chemical shift range of carbon, respectively. FIG. 9 shows the uncorrected proton decoupled 1D $^{13}$C-NMR spectrum of a 20 μmol sample of cholesterol (8 mg) in $CDCl_3$, acquired with 16 transients, 64,000 complex points, and a spectral width of 20,000 Hz on a 500 MHz Varian VXR spectrometer.

In order to demonstrate the stability of the autophasing algorithm with regard to baseline distortions, the first complex point was multiplied by a factor of 200, the second by 100 and the third by 2 prior to zero filling to 65,536 points and Fast Fourier Transform (FFT). Similar distortions will be produced by instrumental problems due to long recovery times or extensive time averaging of signals. The RMS S/N ratio is below 10, except for the three strong solvent signals around 77 ppm. The peak picking algorithm identified 46 signals above the noise level and determined the corresponding transition frequencies.

The model lineshape was taken to be Lorentzian and the linewidth was assumed to be equal to the digital resolution, hence $\tau \approx 1 / \pi$. Initial intensity values are not critical and were set to produce a signal height of ⅓ of the maximum intensity in the spectrum for all lines. The phase correction was based on 26 signals with parameter and error values from the nonlinear regression analysis that satisfied all signal criteria. For baseline correction, the zero$^{th}$ order baseline parameters from all regression analyses whose first order corrections were small in both the real and the imaginary data sets were used for interpolation.

Figure 10:
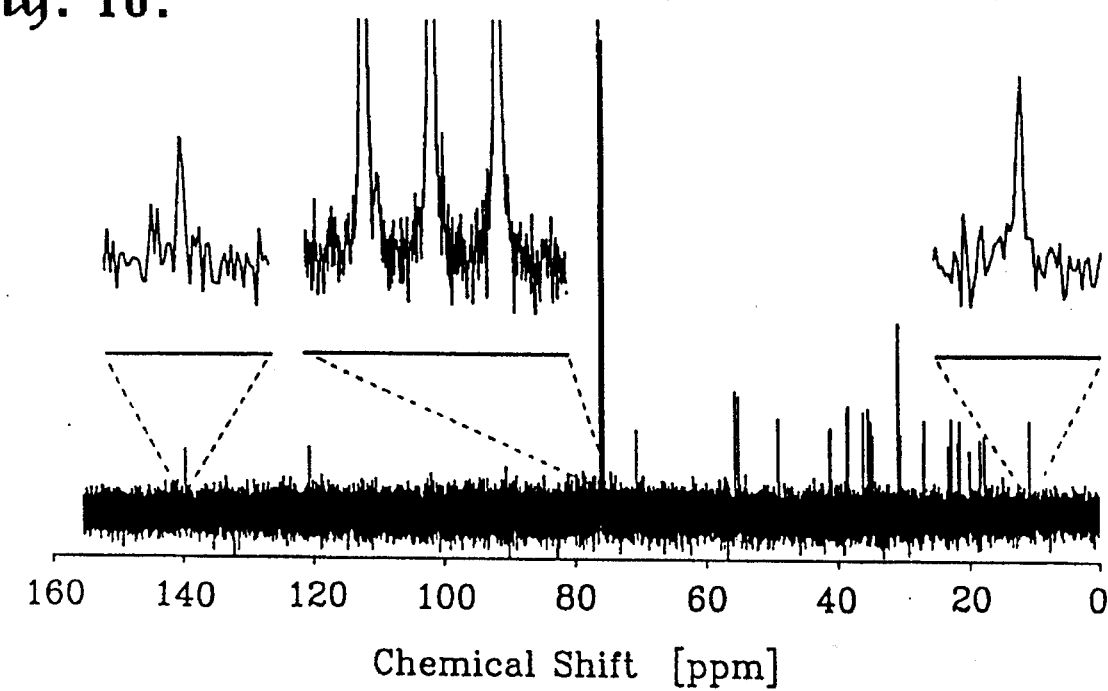

Since a frequency dependent phase correction gives a sufficiently linear phase shift over the width of a signal, a phase function according to Eq. 3 can be used for smoothing and interpolation of determined phases. Neither a correction for peak overlap using the nonlinear regression analysis with an overlap model nor the use of a Lorentzian convoluted with a *sinc* function model, normally appropriate for these spectra, is necessary to get a sufficiently accurate phase correction. Baseline and phase corrections were applied and FIG. 10 shows the corrected spectrum. All signals in the spectrum are well-phased and the baseline is sufficiently flat.

Figure 11:
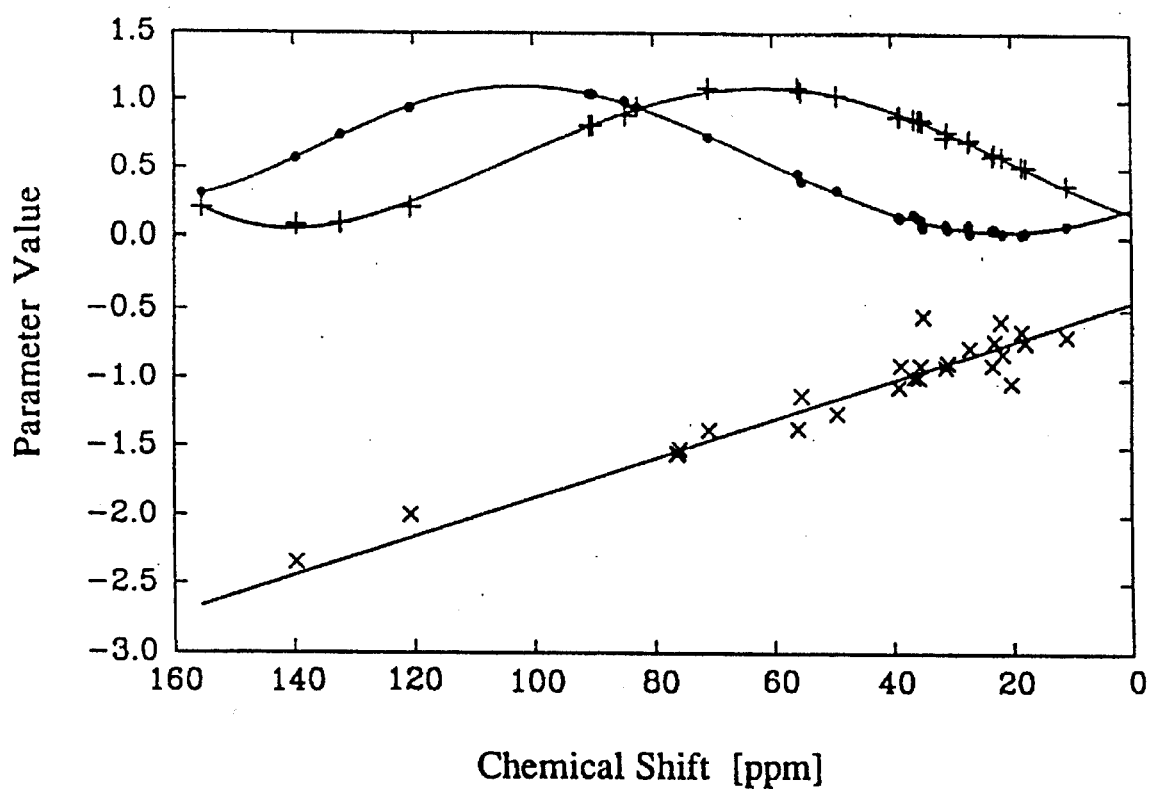
Figure 12A:
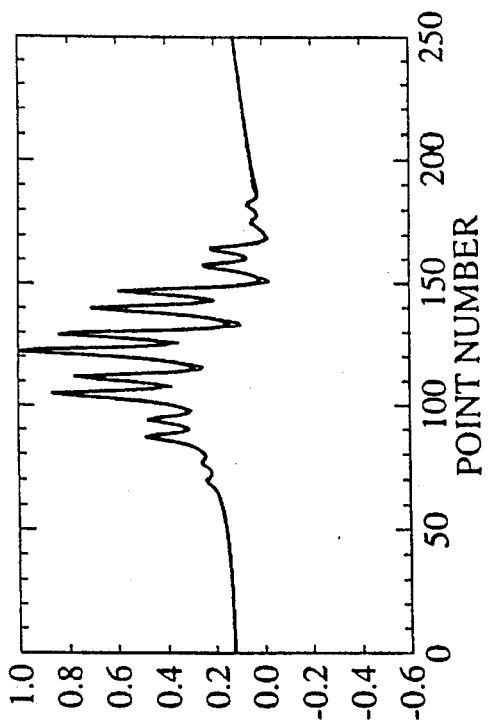
Figure 12B:
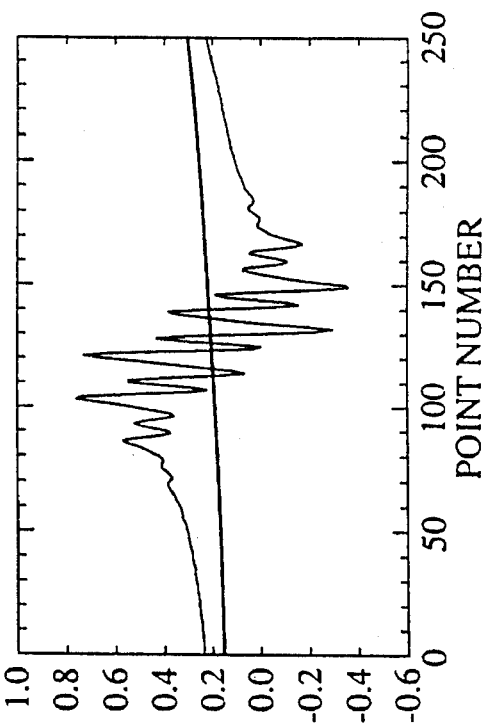
Figure 12C:
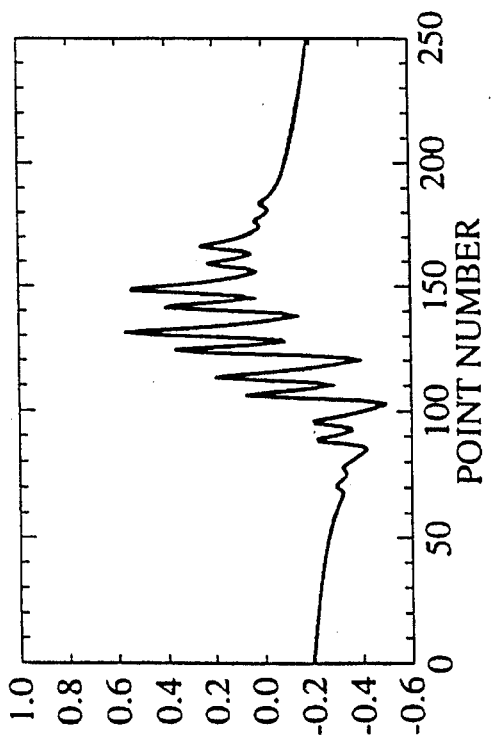
Figure 12D:
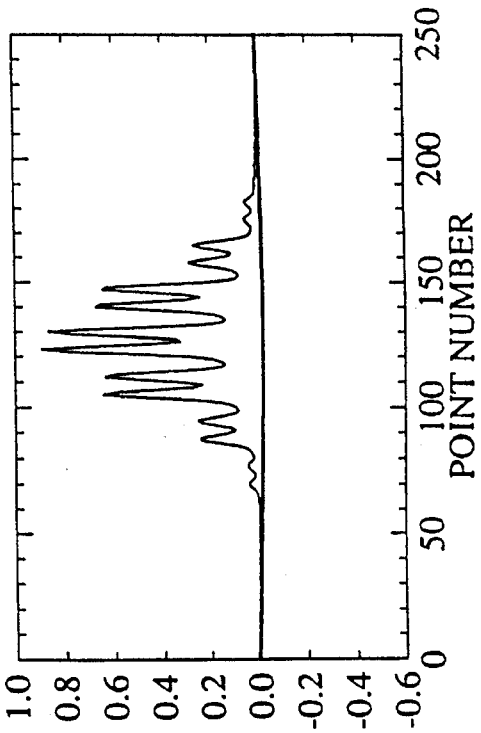
Figure 13B:
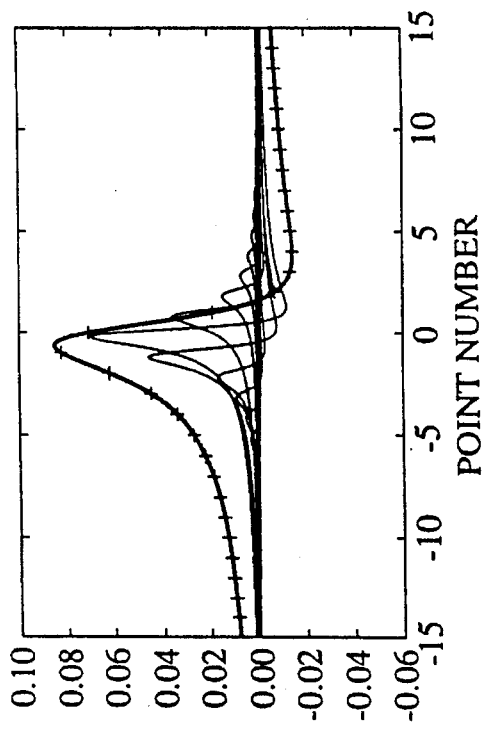
Figure 13D:
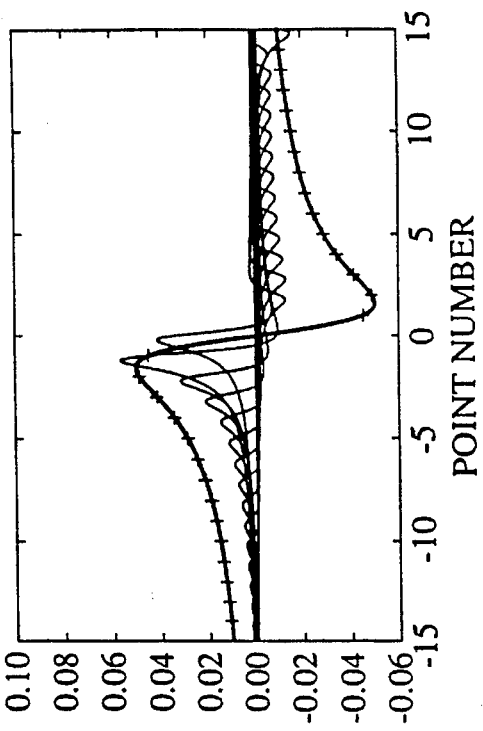
Figure 13A:
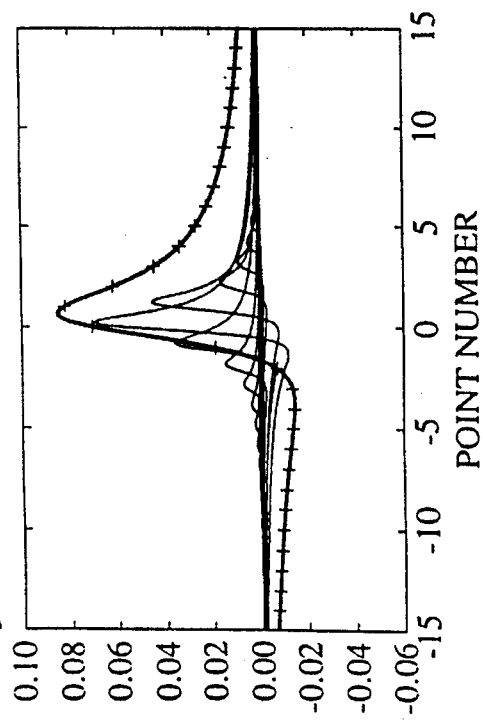
Figure 13C:
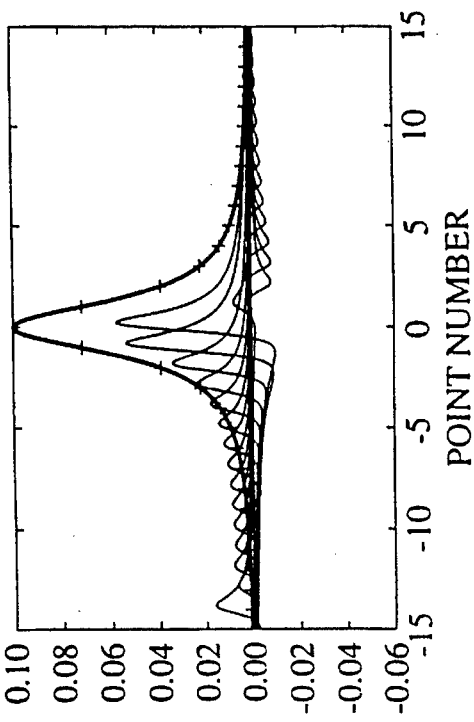

FIG. 11 shows the determined phase parameters (x) as well as the real (Θ) and imaginary (+) spectrum zero$^{th}$ order baseline parameters used for the correction. The phase values weighted by their error values were interpolated by a line. Baseline parameters of the real and imaginary spectra were each approximated by the sum of the first six Legendre polynomials following the method of Pearson *Journal of Magnetic Resonance* 1977, 27, 265, who used four Legendre terms.

The Fourier transform followed by determination and correction of phase and baseline of the whole spectrum took less than 10 seconds on an IBM RS/6000-320 workstation, which is considerably faster than manual phase correction. While in this example the spectral corrections were determined off-line and applied to the spectral data, the spectrometer may be combined with a digital computing device configured to perform the present method and marketed as a single product or system and the determined corrections could be used to correct the data acquisition process.

The Overlap Model

The single line model is normally sufficient for the phase correction of high resolution spectral data. However, if groups of partly or strongly overlapping signals are present, it is necessary to analyze such groups for the distortionless phase correction of spectra or for data without sufficiently isolated signals.

The decomposition model to be discussed later is capable of phase correcting data independently of both the number of signals present and the amount of overlap between signals. However, parameters determined by the decomposition model are averages over the signal region under consideration. In contrast, parameters determined by the use of the overlap model extract the maximum information from every signal in the region if a good fit can be obtained and these parameter estimates are generally preferable.

The overlap model consists of a sum of single line models. The number of lines in a region can be determined by fitting the single line model directly to signals in the data region as previously described. Such a step also provides starting values for the model parameters of the overlap model and by simultaneously fitting the sum of identified single lines to the data region, the parameter estimates are adjusted for the influence of overlap.

FIG. 12 shows plots of a region of overlapping signals from the NMR proton spectrum of menthol. In the upper plots A and B, the light line corresponds to the experimental data and the bold line to the best-fit overlap model of this region. For the identified 14 signals, frequency and amplitude were adjusted independently while a common phase and linewidth parameter were used. In contrast to a linear baseline term for the isolated line model, a second degree polynomial was used to model the baseline due to the wider spectral region. The unphased real (A) and imaginary spectrum (B) show a good agreement between experimental and simulated data and the difference is hardly visible in these plots.

The bottom row of the figure shows the determined phase corrected real (C) and imaginary (D) spectra with the determined (but not applied) baseline correction functions (bold line). The baseline distortion in the imaginary phase corrected spectrum is caused by dispersive tails from strong nearby signals outside the analyzed spectral range.

The Decomposition Model

The regression analysis with a single line or overlap model contains the assumption of a particular signal shape expressed by the model equation. Free parameters in this equation are provided, such as transition frequency, linewidth, phase, and amplitude, to allow adjustment of the model to the data.

In imaging and 1D spectroscopy the overlap of signals can become so severe that no fine structure of the overlap can be resolved. In NMR spectroscopy such resonances frequently arise from samples with positional (e.g., adsorbed species) or orientational dependencies (e.g., nonspinning powder samples) as well as signals from unshimmed magnets. These signals may all be referred to as heterogeneous signals which are not resolved into individual homogeneous signals.

All truly homogeneous signals in experimental absorption mode data are symmetrical and the unsymmetry and complexity of real data arises from the overlap of such signals. Instead of trying to describe the variety of observed lineshapes with a single mathematical equation, the model for the regression analysis will now be extended to a system of equations whose solution describes the decomposition of the observed signal into an overlap of simple lineshapes.

The two main considerations of such a decomposition model are the number of parameters to be estimated and the requirements concerning computer memory and processing time. For every point in a complex spectrum, the amplitude of the signal in the real and imaginary data set are known and hence a spectral region of n points could allow determination of 2n parameters. However, the number of parameters that can be determined will be considerably less, since the data frequently has a low S/N ratio and the signal shapes in the real and imaginary data are correlated.

The estimation of nonlinear parameters requires a compute intensive iterative adjustment of initial estimates. In contrast, linear parameters can be directly calculated without the necessity of initial estimates or iteration. All signals can be expressed as the product of the signal intensity times a lineshape function. The lineshape function is typically one of the homogenous line-shapes in FIG. 2 and even the intensities of overlapping signals can be treated as linear parameters as long as all parameters in the lineshape function are held constant.

For a useful decomposition of the observed signal, the calculated real and imaginary signal amplitudes should be equal to or at least similar to the observed spectral amplitudes. This requirement can be expressed as a set of linear equations. If the complex valued lineshape of a single resonance $i$ is represented as an n-dimensional column vector $a_i$, and m such column vectors, each representing one of the partly overlapping signals, are collected in the n times m design matrix A, then the constraints for n spectral points can be written as $$A \times I = G \quad [7]$$

where the vector I represents the intensity parameters (to be determined) of the assumed single line models and vector G represents the observed spectral amplitudes.

Several additional assumptions are necessary to use Eq. 7 for spectral phase and baseline correction. A trivial solution of the overlap model is obtained if only one intensity parameter is real-valued and all other components of the intensity vector I are zero. Under these conditions the least-squares solution of Eq. 7, using best-fit parameters (e.g., phase, linewidth and frequency) for the single lineshape is identical to fitting the single line model directly to the data. For determination of the nonlinear model parameters in the decomposition model, the evaluation of Eq. 7 can be iterated with varying nonlinear parameter values to optimize a predefined criterion. The solution of an m-line overlap model is identical to the least-squares solution of Eq. 7 under the above conditions with m real-valued intensities. Hence the decomposition model includes the single line and the m-line overlap model as special cases.

The least-squares solution of the m-line overlap model might be under-determined even though the number of data points exceeds the number of parameters, since the data might not allow one to distinguish between several combinations of model parameters. This could happen for severe signal overlap without distinct maxima in conjunction with all m transition frequencies to be determined. The number of assumed overlapping signals in the decomposition model is only limited by the number of parameters to be determined. The above problem can be avoided by defining a grid of assumed resonance frequencies sufficiently dense to describe the observed data. The solution of Eq. 7 will yield zero intensity for assumed grid frequencies where no resonance occurred in the experimental spectrum.

The following assumptions were designed to minimize storage and processing requirements for evaluation of the decomposition model. If the grid of assumed resonance frequencies coincides with the spectral digitization points and the lineshape, width and phase for all single line models in the equation are the same, then A in Eq. 7 is a Hermitian Toeplitz matrix:

$$A = \begin{bmatrix} R_0 & R_{-1} & R_{-2} & \ldots & R_{-n+1} \\ R_1 & R_0 & R_{-1} & \ldots & R_{-n+2} \\ R_2 & R_1 & R_0 & \ldots & R_{-n+3} \\ \ldots & & & & \ldots \\ \ldots & & & & \ldots \\ \ldots & & & & \ldots \\ R_{n-1} & R_{n-2} & R_{n-3} & \ldots & R_0 \end{bmatrix} \quad [8]$$

All elements R along any diagonal are identical and the system of linear equations with this Toeplitz matrix can be solved in mere order $n^2$ operations, as opposed to $n^3$ operations needed for design matrices of a more general form. It is not necessary to store the Toeplitz matrix during the recursive solution of this set of linear equations and the number of storage locations needed is proportional to the number of points, n, in the spectrum.

Instead of solving this system of equations under the constraint that intensities be real valued, Eq. 7 is split into two linear systems of equations, one for the real and one for the imaginary values. This also avoids the more time-consuming complex arithmetic needed to solve the original system of equations. After the decomposition step, the real and imaginary intensity vectors contain the same information as the initial spectrum G, but the data are now expressed in the basis functions described in the design matrix A.

FIG. 13 shows the decomposition of a heterogeneous signal (bold line) into overlapping basis functions (light lines). The basis functions were chosen to possess Lorentzian shape with constant linewidth, transition frequencies that coincide with spectral digitization points and a phase angle of $\pi/4$ for the real (A and C) and $-\pi/4$ for the imaginary (B and D) data sets. The design matrix can be expressed in Toeplitz form and the solution of Eq. 7 will always yield a decomposition where the sum of basis functions is equal to the observed signal at all digitization points (marked by +).

Only if the phase of observed signal and assumed basis functions is identical as in the real (A) and imaginary (B) spectrum in FIG. 13, then all determined intensity parameters of basis functions are positive and the determined intensity distributions of real and imaginary spectrum are approximately equal. The lineshape (bold line) in the real (C) and imaginary (D) spectrum at the bottom of FIG. 13 is well-phased but since the phase of the basis functions was chosen to be $\pm\pi/4$, the determined intensity distribution in both plots is neither equal nor are all determined intensity parameters positive.

An experimental spectrum is a superposition of homogeneous lines and the intensities determined by decomposition are approximately equal to the sum of intensities that would have been obtained by analyzing the isolated homogeneous lines separately. After imposing a penalty on unfavorable parameter values (e.g., reducing the magnitude of determined negative intensities) the parameter values can be used for spectrum simulation and the nonlinear model parameters are estimated through minimization of the squared difference of simulated and experimental complex spectrum. While a zero$^{th}$ order phase distortion does not change the shape of basis functions over the spectral width, a frequency-dependent phase correction destroys this symmetry and hence destroys the Toeplitz form of the design matrix in conjunction with increased storage and processing requirements for model evaluation. Alternatively, the estimated phase function can be applied directly to the data before evaluation of the decomposition model and hence preserve the Toeplitz form of the design matrix for the decomposition step. As mentioned before, the application of a frequency-dependent phase function causes signal distortions and baseline undulations and will produce less accurate results than keeping the data constant during the analysis.

The Nassi-Shneiderman diagram of FIG. 14 defines a response function for the decomposition model of the invention. This is the response function usable in FIG. 8 in the step "Nonlinear regression analysis of signal cluster using the decomposition model." In situations where it is known that the decomposition model must be used for an entire spectrum, such as with normal imaging spectra, a program of the invention can merely include the "Nonlinear regression analysis of signal cluster [now the entire data]using the decomposition model," and an additional step of applying the phase function and, if desired, the baseline function determined during the regression analysis to provide the corrected data.

The response function contains the problem specific information needed for use of a standard regression analysis program to determine best-fit parameters for the decomposition model for the data region under consideration. As shown, the initial step, A, is to get the spectrum or data to be analyzed. From the initial estimate of the baseline parameters which are provided by the regression analysis program, the response function calculates a baseline function in step B. In C the calculated baseline function is subtracted from the initial spectrum. Steps D and E apply to a special case and will be described later. In the general case, the program moves from C to F (set vector F to be equal to vector G) and calculates the coefficient matrix of the linear set of equations which represents the assumptions of the model and is determined on the basis of the chosen lineshape function and the estimated line-shape parameters. Next, step G, is to solve the set of linear equations for the linear model parameters representing intensities using a predetermined criterion, such as best real-valued intensities in a least-squares sense. In practice the system of linear equations is not solved using the Moore-Penrose generalized inverse of the design matrix as shown in step G, but by less compute intensive matrix decomposition techniques or by specialized schemes that take advantage of a particular characteristic of the design matrix. While various conditions can be imposed on the derived solution of the set of linear equations, in most cases it is less compute intensive to enforce such conditions by penalizing certain undesired solutions of the set of equations in the nonlinear regression analysis. Thus, while a constraint of non-negative intensities can be placed on the solution obtained in step G, step H can be included to reduce the magnitude of negative intensities as well as to penalize other undesired outcomes. After solving the set of linear equations to obtain all model parameters, the spectrum is simulated using the determined parameter values from step I and the spectrum of residuals corresponding to the goodness-of-fit of the model to the data is determined in step J. The regression analysis program will, based on this result, determine a new set of parameter values and reexecute the response function to determine the goodness-of-fit corresponding to the new set of parameter values. The process is iterated using the response function shown until best-fit is obtained.

In a special situation to reduce computational requirements for solving the set of linear equations it is assumed that the phase angle of the basis functions over the spectral width in step F is constant. When such assumption is made for the model, in order to determine frequency-dependent phase parameters, it is necessary to add steps D and E. In step D a phase function based on estimated or corrected phase parameters is calculated and this phase function is applied in step E to the spectrum. The best linear model parameters are determined from this phase corrected spectrum and the simulated spectrum of step I is compared to this spectrum in step J to determine the best-fit of both spectra. During further iterations, the baseline and phase parameters used in steps B and D as well as the lineshape parameters used in step F are further improved by the regression analysis program.

Probably the best test for a phasing program is the correction of spectra with various shim distortions. Such an application of the program is described in U.S. Pat. No. 5,218,299.

Figure 15:
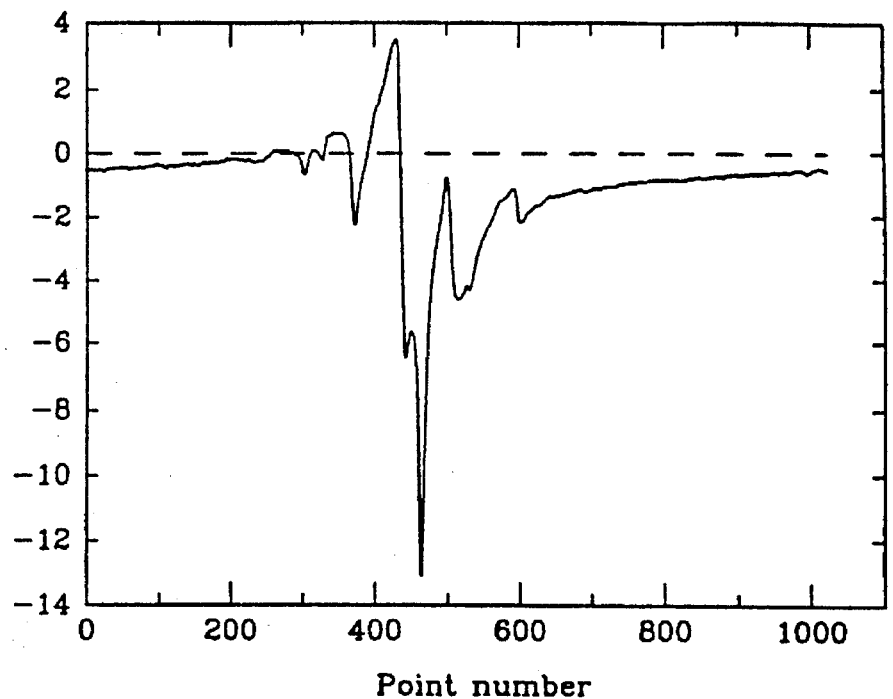

Baseline distortions in conjunction with an unknown phase and signal shape pose an additional problem. FIG. 15 shows the uncorrected $^{23}$Na NMR spectrum of a $Na_2 MoO_4$ powder sample spun at 6 KHz and acquired on a VARIAN VXR200 spectrometer with a spectral window of 50 kHz. $^{23}$Na is a quadrupolar nucleus and the baseline distortions are caused by instrumental artifacts due to the early sampling of the FID which lasts only a few milliseconds, and the phase distortions are caused by timing delays as described previously.

The baseline distortions can be expanded in a linear combination of basis functions and the baseline coefficients are treated as nonlinear model parameters. The best-fit baseline is calculated from the corresponding parameters. This function is then subtracted from the experimental data before applying the phase correction followed by the decomposition step as described above.

The Fourier Transform is a linear operator and the distortion in the frequency spectrum caused by each individual point of the FID can be calculated and a weighted sum of such spectra used for baseline correction of the spectrum in FIG. 15.

Each real FID point corresponds to a delta function, $\delta_t$, at time t in the time domain spectrum. The FT of such a signal is given by $$FT[\delta_t] = \int_{-\infty}^{\infty} \delta_t\, e^{i\omega t} dt = \cos(\omega t) + i\sin(\omega t) \quad [9]$$

Frequently the exponent in the Fourier integral is chosen to be negative, thus inverting the sign of the imaginary spectrum. The first real FID point corresponds to a delta function at time zero and yields a complex frequency spectrum with a constant amplitude of one in the real and zero amplitude in the imaginary spectrum.

FIG. 17 shows the real (bold) and imaginary (light) functions from Eq. 9 over the width of a spectrum resulting from distortions of the real FID points (left side) and the imaginary FID points (right side) for points one to five. Decomposition of a frequency spectrum into a signal and a sum of these baseline functions allows one to determine and eliminate the influence of instrumental artifacts on the first few points in the FID.

Figure 16:
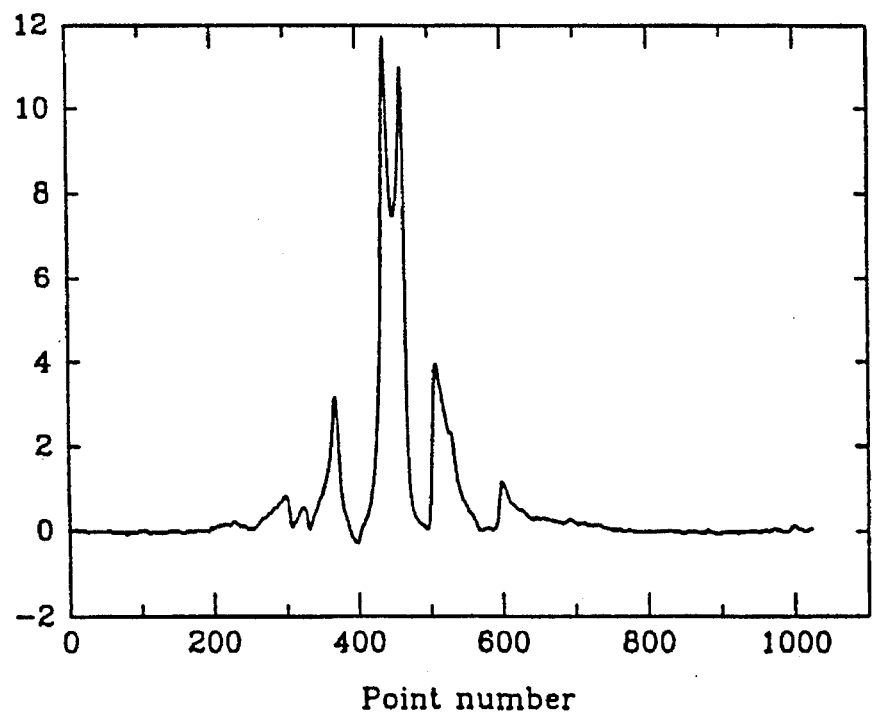
Figure 18A:
Figure 18B:
Figure 18C:
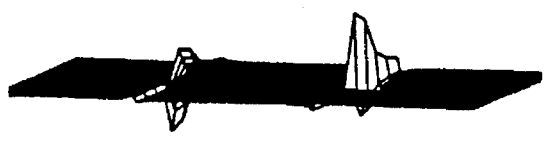
Figure 18D:
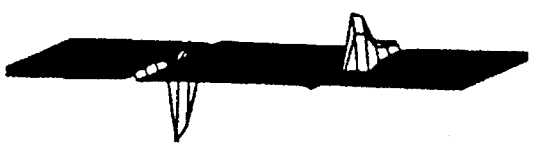
Figure 18E:
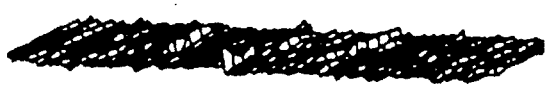
Figure 18F:

The width of the spectrum in FIG. 15 was taken as wide as necessary to avoid aliasing of dispersive signal tails. The spectrum was decomposed as described before and one fifth of signal intensities at both ends of the spectrum were set to zero to decrease the correlation between baseline and phase parameters. This kind of spectrum only contains positive absorption signals and determined negative intensities in the real and imaginary data set were penalized by setting the corresponding intensity parameters to zero. The real spectrum was simulated from the corrected imaginary intensities and vice versa to penalize a difference in the determined intensity spectra due to phase distortions. Minimization of the least-squares deviation of this simulated complex spectrum from the experimental spectrum yielded the phase and baseline corrected spectrum in FIG. 16.

Since frequency dependent phase corrections of the experimental spectrum distort the lineshape and introduce additional baseline distortions, all phase distortions should be included in the model rather than changing the spectral data during the analysis. Instead of determination of a real and an imaginary spectrum of residuals by solving Eq. 7 separately for real and imaginary data sets, the spectrum of intensities should be determined in a least-squares sense from the complex data. Constraints such as non-negative intensities should be imposed on the solution of the set of linear equations rather than be approximately enforced by the use of penalty functions during the nonlinear regression analysis. It would also be preferable to use a grid of resonance frequencies with increased grid density in signal regions and decreased density at the edge of the spectrum.

None of these improvements can be implemented using a Toeplitz design matrix or a matrix solvable with equivalent efficient methods in memory and speed. However, with specialized hardware or the availability of faster computers, these improvements should be used. The incorporation of higher order phase distortions in the model, the intensity spectrum in a least-squares sense and the non-uniform grid density can be solved by matrix decomposition techniques such as singular value decomposition (SVD) and linear systems of equations with constraints can be solved by methods of linear programming (LP).

Time domain and frequency domain data are, in principle, equivalent and both domains have advantages and disadvantages. Basis functions for the decomposition model in the time domain are the inverse Fourier transformed frequency domain lineshape functions from FIG. 2. These transformed functions are commonly referred to as decaying sinusoids. Since convolution in the frequency domain is equivalent to a simple product of functions in the time domain (convolution theorem), the use of frequency models describing the convolution of various lineshapes is greatly simplified in the time domain. Furthermore, if the first few FID points contain distortions, they simply can be excluded from the analysis rather than be detected and corrected after they have influenced all spectral points in the form of baseline distortions after the Fourier transform. Unfortunately, the decomposition of time domain data requires the simultaneous analysis of all spectral signals and also requires more time and space intensive matrix decomposition techniques for solution of the set of linear equations.

Phase Correction of Two-Dimensional INADEQUATE Spectra

The extension of this autophasing method to n-dimensional spectra is straightforward. The following example shows how to optimize this general approach for two-dimensional (2D) so-called Incredible Natural Abundance Double Quantum Transfer Experiment (INADEQUATE) spectra. If all four transitions caused by a $^{13}C$—$^{13}C$ coupling are modelled simultaneously rather than as isolated lines, dependencies between these lines can be included in the model, which reduces the number of parameters needed. This also allows one to include the relative signs of the transitions in the model, making intensity parameters always positive, and to exclude incompletely suppressed signals from the phase detection since they do not fit the four-line model.

A 2D-INADEQUATE spectrum of 1,1-dimethyltetralin described in R. Dunkel et al. *Journal of Magnetic Resonance* 1990, 90, 290 is used here to demonstrate 2D autophasing. In the double quantum direction a Lorentzian line broadening of 80 Hz was applied to the data and the fitting was done using the model of a Lorentzian line convoluted with a sinc function.

The upper row of FIG. 18 shows the four transitions of the bond signal of carbons 1–2 in 1,1-dimethyltetralin in the real/real data set. The middle row contains the best-fit simulated data and the bottom row shows the residuals. The complete spectrum comprises 128 MBytes of data, and the complete hypercomplex data of the shown bond region in all four phase quadrants contains about 0.03% of the spectral points.

Figure 19:
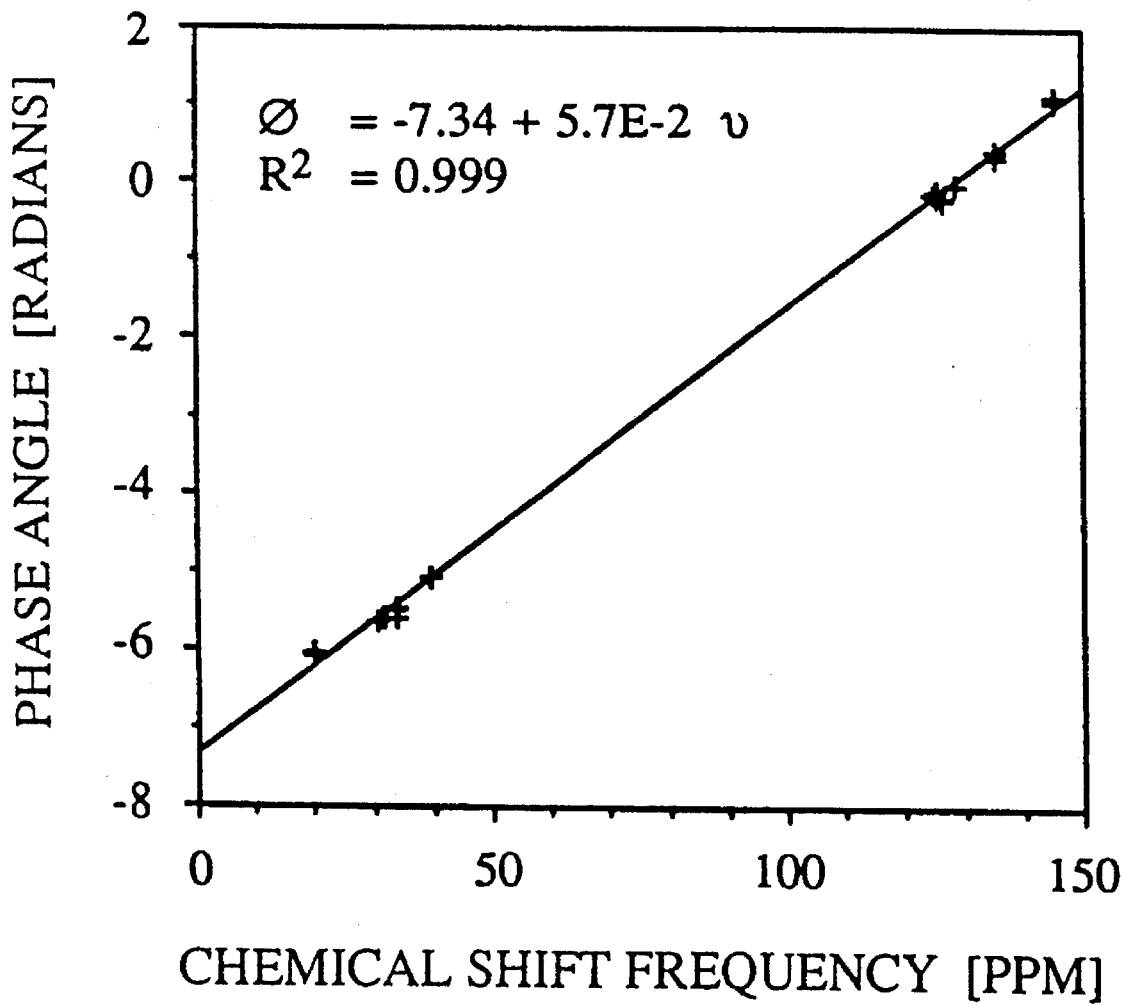

The correlation coefficient of the linear phase function of all determined phase angles for bond regions in the shift direction in FIG. 19 of $R^2=0.999$ indicates that the autophasing method detects phases objectively and significantly more accurately than can be achieved by manual phasing. The phase shift of more than $2\pi$ across the spectrum is due to the removal of the severely distorted first point in all 2D-FIDs in the F2 direction. An additional baseline correction was not necessary.

Figure 20:
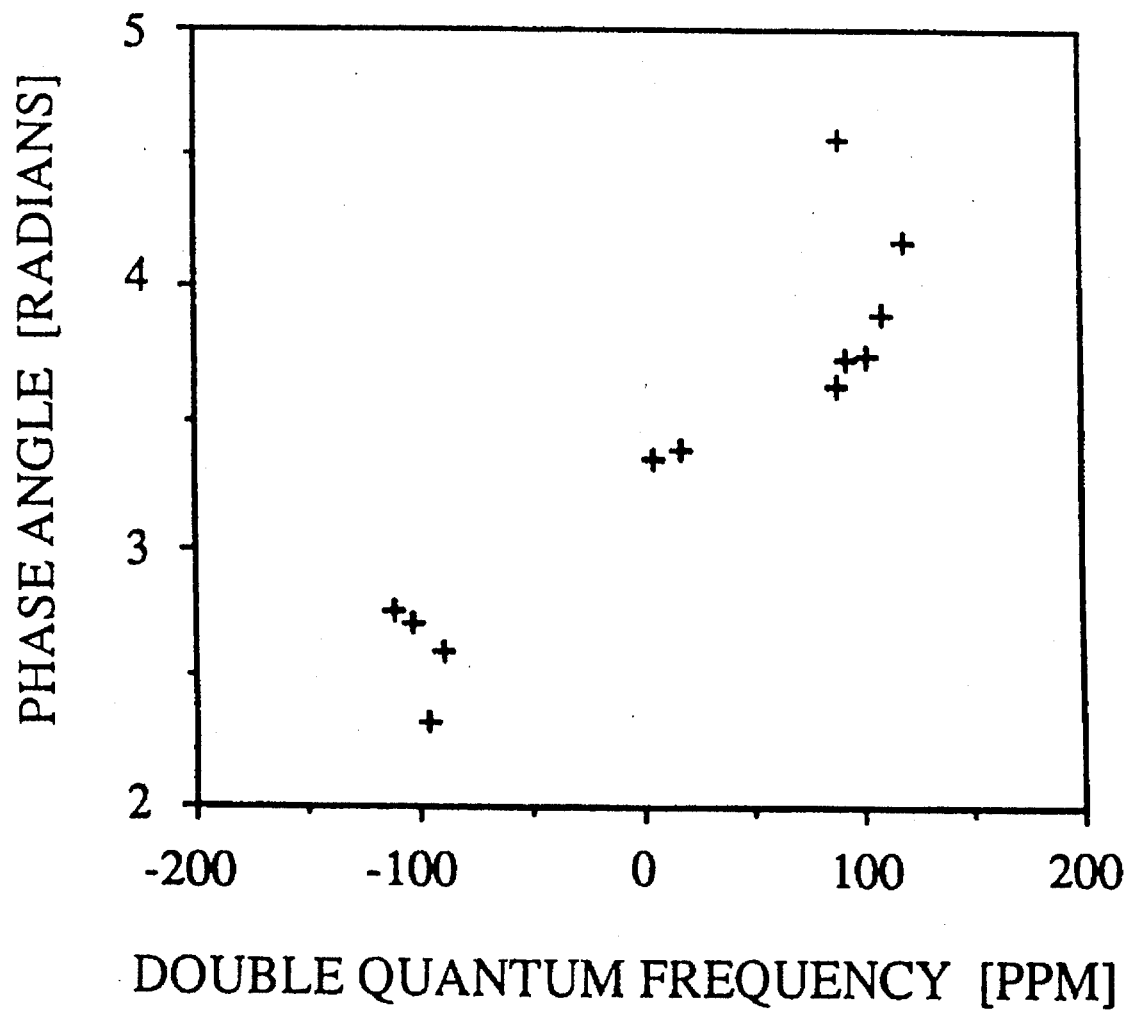
Figure 21A:
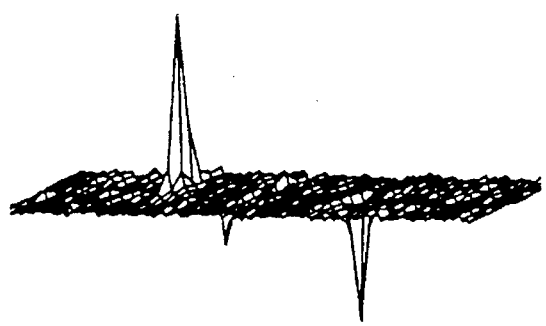
Figure 21B:
Figure 21C:
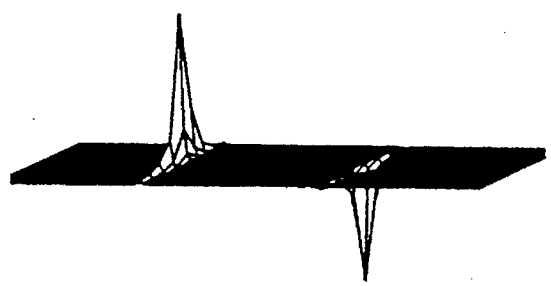
Figure 21D:
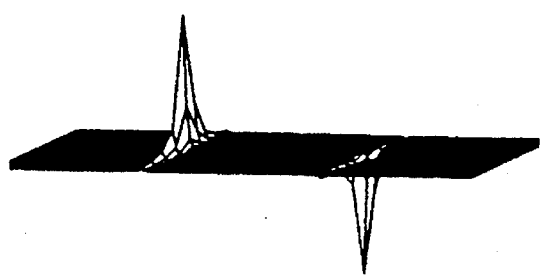
Figure 21E:
Figure 21F:

The simple assumptions valid for 1D spectra can break down for higher-dimensional spectroscopy, and phases in the double quantum dimension, see FIG. 20, are not only correlated with frequency but also with the extent of second order effects present in every bond signal. Hence, a frequency-dependent phase function should not be used in this direction and every quadruple of satellite lines is phased individually by the determined phase angle in the double quantum (F1) dimension. FIG. 21 shows the now well-phased transitions from FIG. 18. Normally only this real/real data set containing the pure absorption mode data is used in further steps of manual data manipulation and interpretation.

Figure 22:
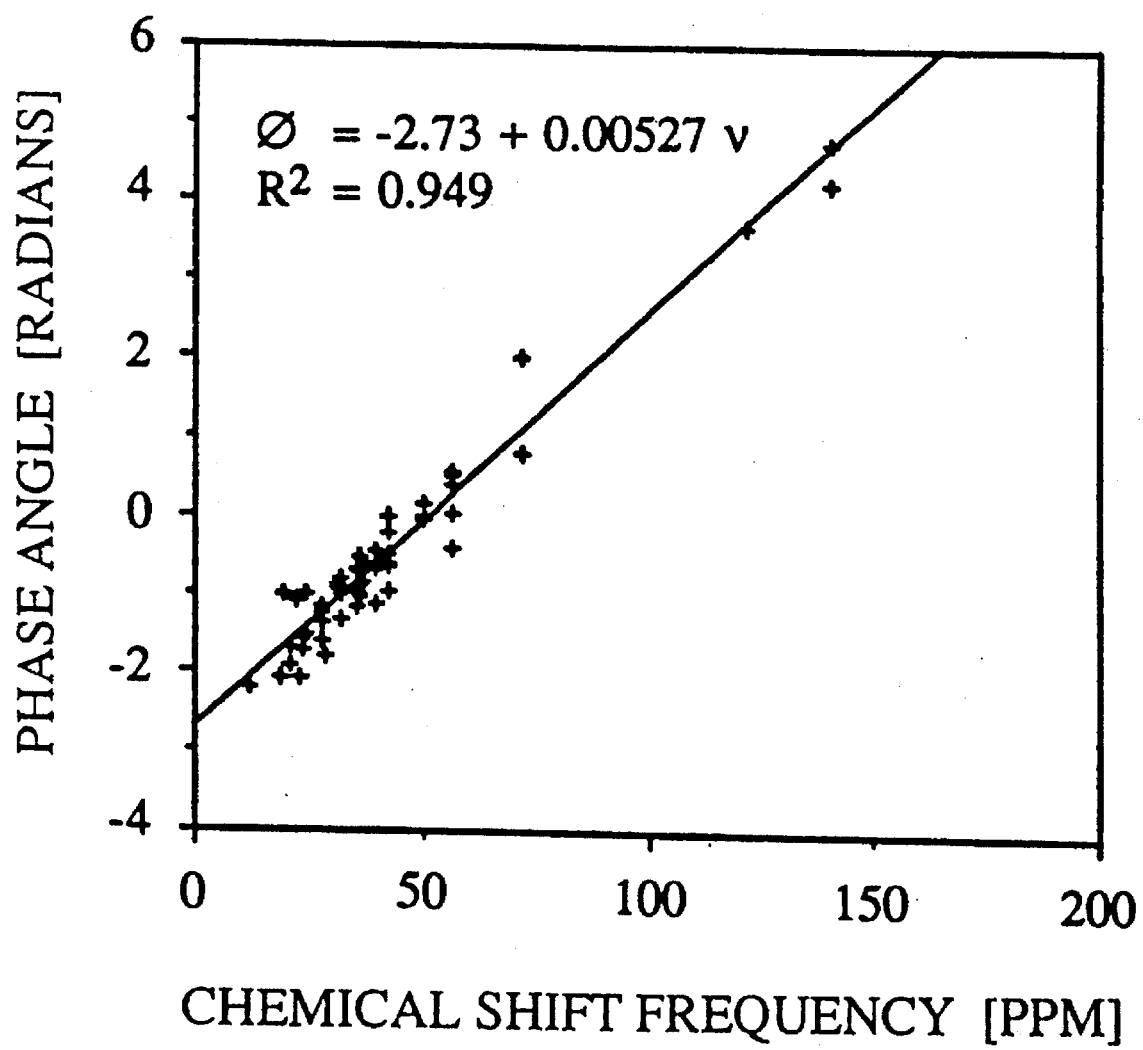
Figure 23:
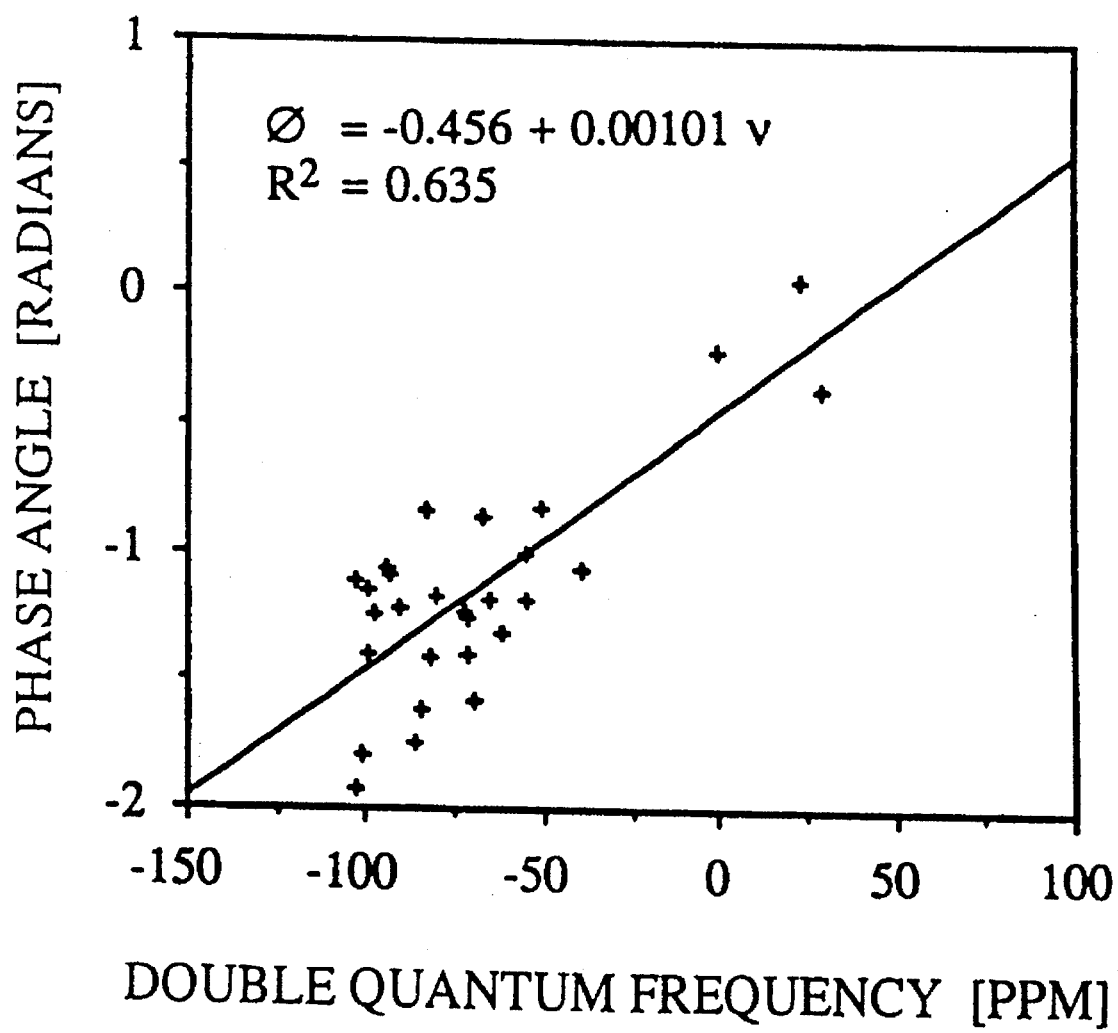

FIG. 22 gives the determined phase angles in shift direction for the 20 μmol sample of cholesterol shown as a 1D spectrum in FIG. 10. Since the $^{13}C$—$^{13}C$ coupling signals observed in the 2D spectrum are about one hundred times weaker than the $^{13}C$ signals in the 1D spectrum, the S/N ratio in the 2D spectrum is, despite additional signal averaging, too low for manual phasing and interpretation of the spectrum. Automated phase correction can be easily done based on the determined phase parameters given in FIGS. 21 and 22. Since all signals are below the noise level even after phase correction, manual interpretation is not possible and the data has to be analyzed automatically using regression analysis.

Correction of Spectral and Imaging Data

Most model parameters for spectroscopic and imaging data can be grouped into scaling, position, lineshape and distortion parameters. Additional information such as coupling constants and signal integrals can be frequently derived from the basic parameters but might also be used as fitting parameters directly. The following list describes examples of possible uses of the four parameter classes for the correction of NMR data.

Scaling Parameters:

The area of an NMR signal is proportional to the excitation power and the number of resonating nuclei, provided no saturation of the sample occurs. Before the data acquisition the sample is normally in an equilibrium state and hence monitoring signal integrals during a sequence of data acquisitions allows the determination of progressive resonance saturation from which the relaxation characteristics (T1 value) of each resonance can be calculated. Saturation is important both for the sensitivity of the data acquisition and when relative signal areas are of interest. From the derived degree of saturation the number of steady-state pulses and the delay time between pulses can be automatically adjusted to obtain and maintain the desired degree of saturation.

Position Parameters:

An important requirement for time averaging of data and for the comparison of datasets is that every signal has the same position in all datasets. A hardware lock circuit is generally used in NMR to compensate for possible drifts in the magnetic field. The state-of-the-art hardware lock uses a deuterium signal for locking while data only on other kinds of nuclei can be acquired. As a consequence the sample has to be contaminated with a (deuterium containing) lock substance. For deuterium containing samples a special probe has to be used for locking on a different kind of nucleus (e.g., fluorine). Monitoring the position of observed signals and correcting the acquisition equipment to compensate for drifts in signal position eliminates the need for a lock substance and for different probes using different lock nuclei. In addition, lock and observe nucleus may now be the same eliminating the possibility of relative shifts between different kinds of nuclei and avoiding an inferior locking accuracy caused by broad (e.g., deuterium) lock signals.

If signals are to be removed from the data such signals can be simulated from determined parameter values and subtracted from the experimental data. The most frequent application is the removal of the water resonance from a proton NMR spectrum of an aqueous sample solution. The water signal might be orders of magnitude stronger than the resonances to be observed. In addition, possible magnetic field inhomogeneities or a partial experimental suppression of the strong resonance might cause lineshape distortions of this resonance.

The decomposition model is general enough to accurately model the resonance to be removed. The determined resonance frequency distribution of such a signal is typically only a small fraction of the observed linewidth. By simulating this resonance from the decomposition parameters and subtracting it from the experimental data the signal including its tails are removed from the whole spectrum. Only those signals resonating in the small resonance frequency range of the resonance to be removed are possibly altered through the signal removal. The result is that removal of the strong resonance will not remove signals located on its tails as long as they lie outside the small frequency resonance range of the deconvoluted strong resonance.

For signal suppression in 2D spectra the unwanted resonance can either be removed directly from the 2D frequency spectrum or be removed after the first Fourier transform of the dataset by removing the resonance individually from every spectral 1D trace before the second Fourier transform.

Lineshape Parameters:

In high resolution NMR the signal lineshape is dominated by inhomogeneities of the applied magnetic field. The lineshape parameters or various moment criteria of the lineshape can hence be used to determine needed adjustments of shim currents to reduce the magnetic field distortions. See U.S. Pat. No. 5,218,299 for details.

Distortion Parameters:

Phase and baseline distortions of spectroscopic and imaging data frequently require correction. The distinction between desired features and data distortions is not always clear. For some experiments in both spectroscopy and imaging the signal phase contains information. In either case the regression model should include distortion parameters if necessary to obtain an accurate numerical description of the data. The determined parameter values can then be used for the correction of the data as described in U.S. Pat. No. 5,218,299 or can be used as part of the automated analysis of the data.

Signal Identification and Detection Probabilities

The approach common to the described correction and automated analysis of data is to obtain a numerical data description using regression analysis. The challenge lies in construction and use of the regression model so that all data features of interest are captured in model parameters. Based upon the obtained parameter and error values, undesired features of the data can be removed. Correction of the data is an important step, but the goal of spectroscopy and imaging is to answer questions concerning the subject under investigation. From the obtained numerical data description the desired information can be obtained directly as described below without having a spectroscopist to analyze the corrected data.

The goal of the automated analysis of data is to detect and numerically describe all relevant spectral signals. The challenge is to derive criteria to distinguish genuine signals from noise and to determine detection probabilities based upon the criteria used.

Suppose one uses a model to describe experimental data with p adjustable parameters, represented by a vector, x, applied to a set of data with m points. Derivatives of the expectation function, S, with respect to x evaluated for all the m points in the data set can be written as a Jacobian matrix, D, as $$D = \qquad [10]$$

$$\begin{bmatrix} \left(\frac{\partial S}{\partial x_1}\right)_1 & \left(\frac{\partial S}{\partial x_2}\right)_1 & \left(\frac{\partial S}{\partial x_3}\right)_1 & \cdots & \left(\frac{\partial S}{\partial x_p}\right)_1 \\ \left(\frac{\partial S}{\partial x_1}\right)_2 & \left(\frac{\partial S}{\partial x_2}\right)_2 & \left(\frac{\partial S}{\partial x_3}\right)_2 & \cdots & \left(\frac{\partial S}{\partial x_p}\right)_2 \\ \left(\frac{\partial S}{\partial x_1}\right)_3 & \left(\frac{\partial S}{\partial x_2}\right)_3 & \left(\frac{\partial S}{\partial x_3}\right)_3 & \cdots & \left(\frac{\partial S}{\partial x_p}\right)_3 \\ \vdots & \vdots & \vdots & & \vdots \\ \left(\frac{\partial S}{\partial x_1}\right)_m & \left(\frac{\partial S}{\partial x_2}\right)_m & \left(\frac{\partial S}{\partial x_3}\right)_m & \cdots & \left(\frac{\partial S}{\partial x_p}\right)_m \end{bmatrix}$$

The column index ranges over all the parameters, represented by vector x, while the row index ranges over all the m data points to produce an m by p matrix. The square p by p curvature matrix, C, is then approximated as (Press, W. H.; Flannery, B. P.; Teukolsky, S. A.; Vetterling, W. T. *Numerical Recipes. The Art of Scientific Computing*; Cambridge Univ. Press: London/New York, 1986; p.523):

$$C = \tfrac{1}{2} D^T D \qquad [11]$$

Assuming the errors in the experimental data are randomly distributed, an estimate of the variance-covariance matrix, Cov, of the fit is obtained by inverting C and scaling the result by the residual sum of squares, $X^2$, divided by the degrees of freedom (m-p) to yield $$Cov = \frac{\chi^2}{m-p} C^{-1} \qquad [12]$$

from which the variances and covariances of all the parameters can be extracted. An estimate of the marginal standard deviation in parameter $x_i$ is obtained from the diagonal elements of the variance-covariance matrix by $$\sigma(x_i) = \sqrt{Cov_{ii}} \qquad [13]$$

Based on the supposition that a fit of the model to a sufficiently strong signal will lead to well-defined parameter values, the precision of parameters or a similar ratio of parameter and related error value should be used as a criterion for signal existence. The parameter precision, $P(I_i)$, is defined as $$P(I_i) = \frac{I_i}{\sigma(I_i)} \qquad [14]$$

$I_i$ is a model parameter and will be used in the following discussion to be the signal's intensity parameter. The parameter precision measures how closely the outcomes of multiple measurements cluster about the mean value of a specified parameter and indicates how well this parameter value is determined by the data. The precision implies repeatability of the observation and does not necessarily imply accuracy. A relationship describing the precision of fitted parameters as a function of the S/N was published by Posener in *Journal of Magnetic Resonance* 1974, 14, 121.

$$P(I_i) = c(I_i)\sqrt{K}(S/N) \qquad [15]$$

where $c(I_i)$ is a constant which depends upon the lineshape and the kind of parameter to be determined and K is the number of data points per linewidth at half height and (S/N) is the signal-to-noise ratio. The motivation for choosing parameter precisions instead of parameter values or error values for the definition of signal criteria resides in the independence of precisions on the spectral amplitude scaling. The suggested use of marginal standard deviations as error values results from their ease of computation and from their due consideration of correlations between model parameters. When the overlap model is used all mutual parameter correlations of signals in an overlap cluster are considered.

To use the parameter precision or related criteria for the determination of detection probabilities the effect of noise on the outcome of the analysis has to be evaluated. To explore the effect of noise on the detection of an experimental signal, the best-fit simulated signal is determined by regression analysis. Then different samples of pseudo-random noise are added to this simulated spectrum and the resulting simulated datasets are subjected to the same analysis as experimental data. This procedure is often referred to as Monte Carlo simulation (Press, W. H.; Flannery, B. P.; Teukolsky, S. A.; Vetterline, W. T. *Numerical Recipes. The Art of Scientific Computing*, Cambridge Univ. Press: London/New York, 1986; p.531).

A genuine signal can be expected to result in a much larger precision for all determined parameters than a noise related pattern. The objective here is to establish an adequate signal detection criterion. The determination of a signal detection criterion and the derivation of detection probabilities is discussed using the detection of four-line bond signals (AB spin systems) in 2D INADEQUATE NMR spectra. Details of the model equation used as well as the approach of finding such signals in the dataset are described in Dunkel, R. et al. *Analytical Chemistry* 1992, 64, 3133–3149.

Figures 24A, 24B:
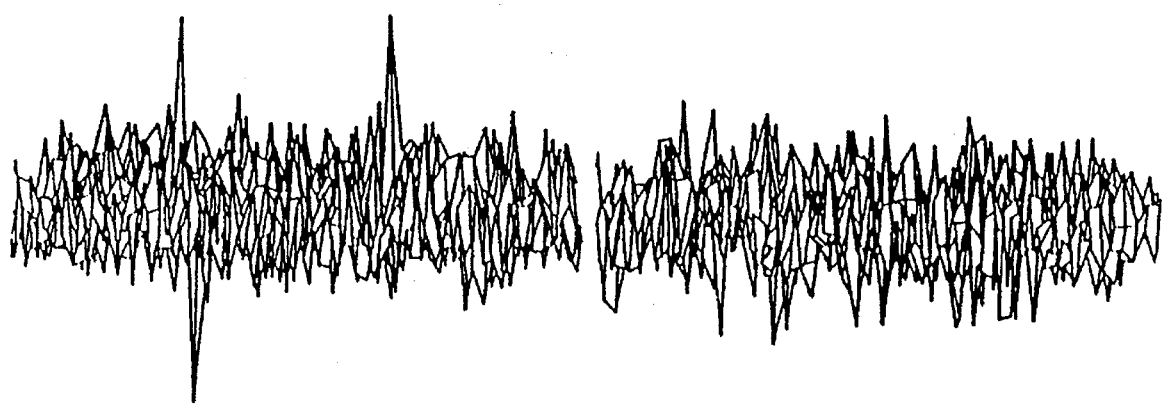
Figures 24C, 24D:
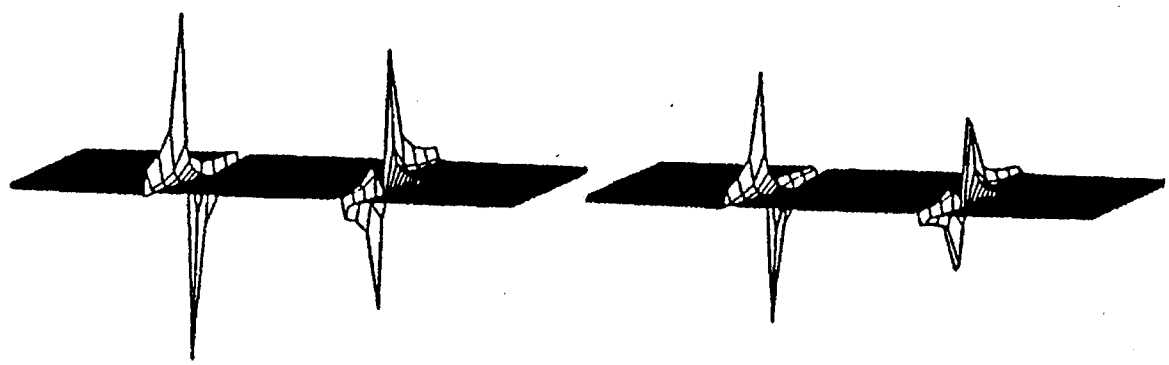

To illustrate the determination of detection probabilities the intensity parameter precision as the sole criterion for distinction of genuine signals and noise will be discussed here. The bottom row of FIG. 24 shows the best-fit simulated pattern of an experimental 2D INADEQUATE bond signal. Noise in 2D INADEQUATE spectra is normally distributed (Gaussian). For the Monte Carlo simulation of a bond signal normally distributed noise is added to the simulated signal to create the desired RMS S/N ratio, like the RMS S/N ratio of five shown in the top row of FIG. 24. Such simulated datasets as well as datasets containing only noise can now be analyzed like experimental data. For all best-fit determined patterns from the Monte Carlo simulation the intensity parameter precision can be determined.

Figure 25:
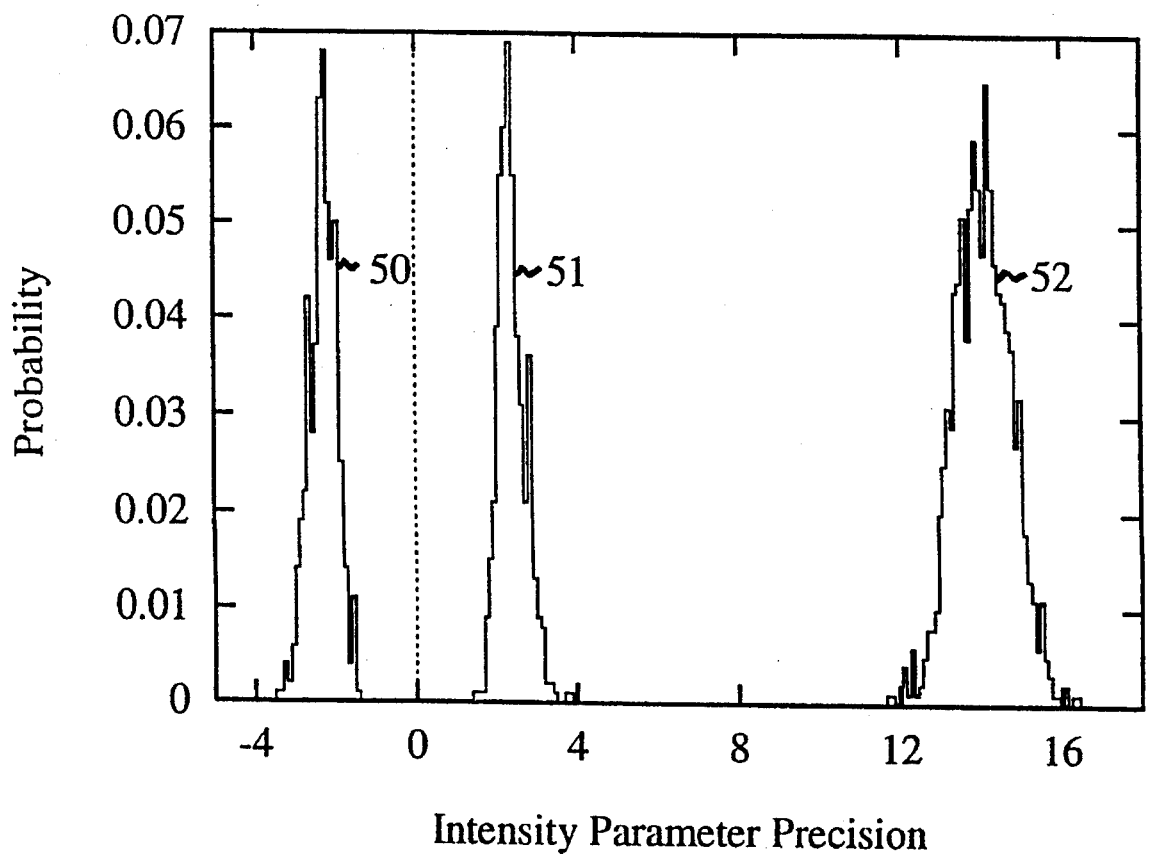

FIG. 25 shows a probability vs. intensity parameter precision diagram showing the distribution of intensity parameter precisions determined for bond and noise only patterns at the RMS S/N of five shown in FIG. 24. The determined parameter precisions for noise only datasets (distribution 50 and 51) and noise plus bond pattern datasets (distribution 52) are based on 1,000 Monte Carlo simulations each. All noise only distributions are bimodal (e.g., distribution 50 and 51) because, in underdigitized spectra such as those used here, a slight shift in parameter values will locate a noise excursion that gives some agreement with the model, and because the probability that no such noise excursion exists in the dataset is small. Negative parameter precisions (distribution 50) in the noise only simulations result from negative determined intensities that are not excluded by the model and can be found in noise even though they have no physical meaning for a correctly phased spectrum.

As long as the distribution derived from pure noise does not overlap the distribution derived from noise plus signal (distribution 52), it is presumed, since the distributions shown are based on 1,000 simulations, that an intensity parameter precision threshold value can be chosen where bonds will be correctly detected with at least 99.9% confidence, and non-bonds will be rejected with the same confidence.

An attractive feature of parameter precisions is that a different scaling of the data will not influence determined parameter precisions. Hence doubling the amplitude of noise (to an RMS S/N of 2.5) for the Monte Carlo simulation will not change the distribution of determined intensity parameter precisions (distribution 50 and 51) in FIG. 25. The lowest parameter precision determined for bond signals (distribution 52) at the RMS S/N ratio of five is 12. The intensity parameter precision scales linearly with the S/N ratio of the signal as stated by Eq. 15. The lowest intensity parameter precision of 12 for bond patterns will decrease for a S/N ratio of 2.5 to 6. When using a cut-off value of $P(I_i)$ between 4 and 6, bonds and non-bonds can still be distinguished at this lower S/N ratio with a probability greater than 99.9%.

Figure 27:
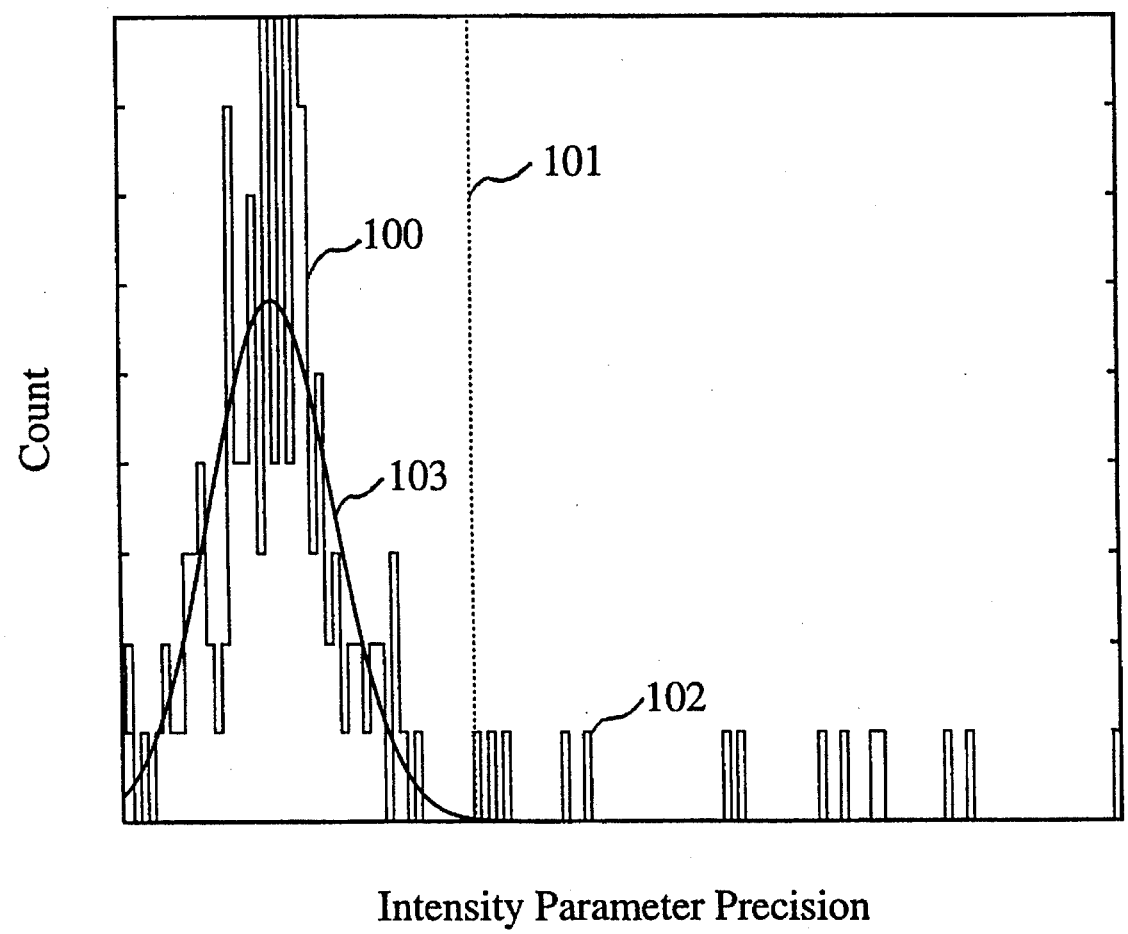

FIG. 27 illustrates use of an intensity parameter precision threshold to determine which bonds are present in a sample. A number of observed parameter precisions for various potential bond positions are plotted on this chart as rectangular regions, with multiple intensity parameter precisions 100 of the same value range stacked. A threshold 101 is established from the above Monte Carlo simulations to provide a 99.9% confidence level of bond detection. Bonds correspond to those intensity parameters 102 greater than the threshold 101. Those intensity parameters 100 corresponding to non-bonds (or noise) are those less than the threshold 101. Monte Carlo simulations provide reliable threshold values under a given set of conditions.

For time critical applications it is impractical to determine for every encountered signal the detailed $P(I_i)$ distribution for signals and non-signals by Monte Carlo simulation as shown in FIG. 25. Monte Carlo simulations are normally too compute intensive to determine the detection probabilities for individual bonds. The normal interpolation function 103 (FIG. 27) of non-bond responses can be determined from the experimentally determined distribution. The probability of responses corresponding to intensity parameter precisions at the right side of threshold 101 being genuine bonds can now be calculated as the probability that the observed precision value stems from the normal distribution 103. For further time savings a mapping function from determined parameter precision to detection probability can be precomputed for typical signal shapes.

It should be noted that by considering only a single parameter precision for signal identification one neglects information from the other parameters that could improve the detection limit. Signal identification should, in principle, be based upon the joint probability distribution of all adjusted parameter values.

Automated Analysis of N-Dimensional Data

Imaging data is inherently three-dimensional. Spectroscopic data can be even higher-dimensional. For example triple and quadruple NMR resonance experiments as used for sequencing proteins lead to four and five dimensional datasets. Compared to the human data analysis, the discussed automation allows to speed up the analysis, improves the reliability of signal detection, increases the complexity of datasets which can be analyzed, provides a quantitative data description, and higher-dimensional datasets pose no conceptual problem to the automated analysis.

Figure 26:
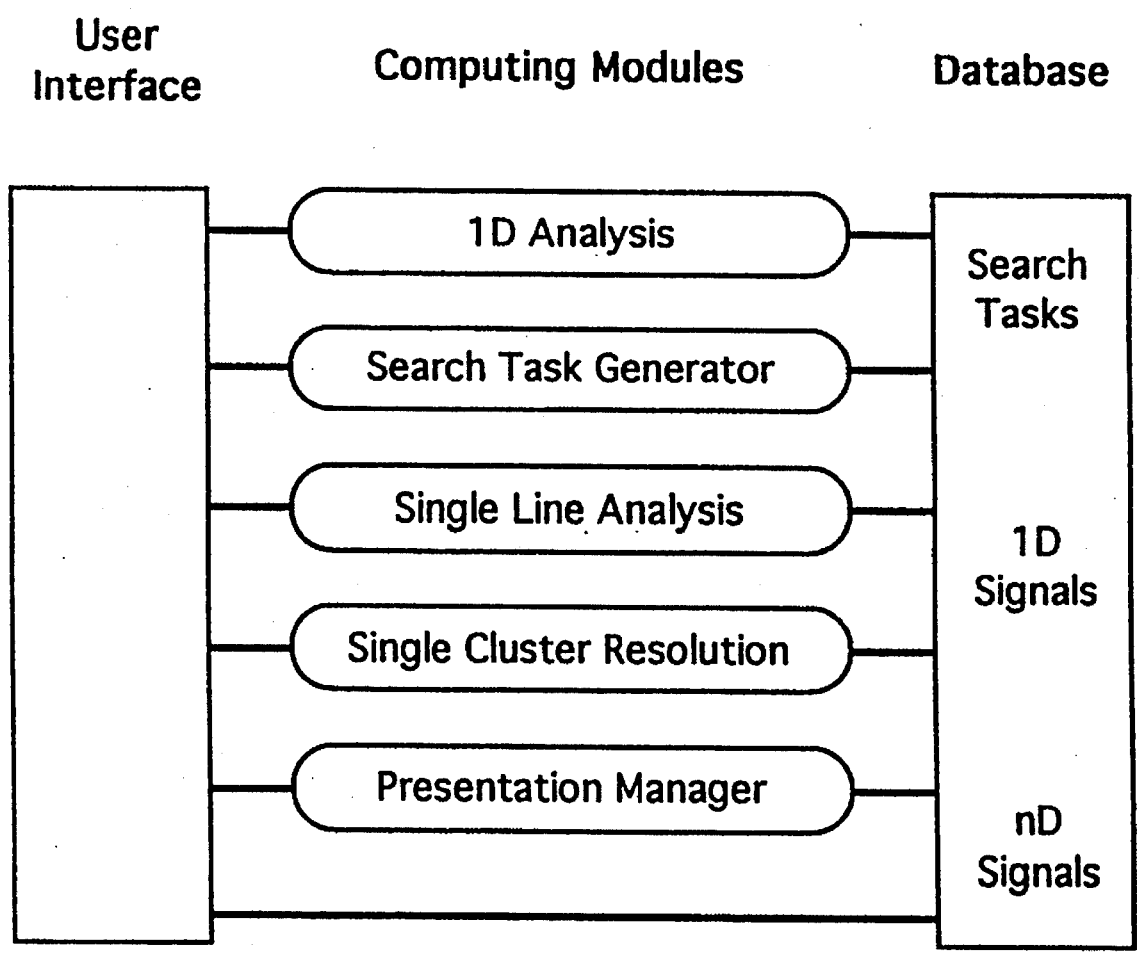

FIG. 26 illustrates the structure of a general nD analysis program. All program functions and analysis results are accessible from the user interface and all determined values are stored permanently in the database. The "ID Analysis" module obtains a numerical description of all signals in one or more one-dimensional spectra and stores this information in the database. The "Search Task Generator" reads the one-dimensional signal description and stores derived "Search Tasks" in the database specifying all spectral regions that need to be searched for possible signals. The "Single Line Analysis" module works through all "Search Tasks" using a regression analysis technique and stores all identified n-dimensional signals in the database. The "Signal Cluster Resolution" module identifies clusters of overlapping signals and corrects the corresponding parameter values for the influence of this overlap as described before. The "Presentation Manager" uses the numerical description of the nD signals stored in the database and presents this data in a more appropriate format to the user.

Only the three modules "ID Analysis", "Single Line Analysis" and "Signal Cluster Resolution" handle raw data and have to be coded for maximum speed performance. The two remaining modules "Search Task Generator" and "Presentation Manager" hide all spectra specific details from the rest of the analysis software. These two modules have insignificant run-times and can be implemented as high-level scripts which are easy to modify.

To simplify the following discussion it is assumed that the analysis program detects one nD signal at a time. If a genuine signal in a spectrum has to appear in more than one position due to spectral symmetry or anti-symmetry then all symmetry related signals should be fitted simultaneously using separate intensity parameters. Only those signals having a sufficient parameter precision for all symmetry related transitions should be regarded as genuine signals.

The "Presentation Manager" can be used to scan the database and report all signal patterns of interest. As long as the functional form of a signal pattern to be analyzed is known the corresponding complex model can be fitted directly to the data. In case of an unknown signal pattern it is preferable to analyze the experimental data as a collection of individual signals. Determination of derived signal patterns (e.g., spin systems) can be performed most conveniently based on the numerical description of individual identified signals stored in the database rather than from the raw data itself. The general nD analysis program shown in FIG. 26 allows the use of an arbitrarily complex analysis model.

Module "1D Analysis":

From the automated analysis of one-dimensional spectra, possible signal positions in a related nD spectrum can be derived which greatly improves the speed of the analysis of the nD spectrum. The approach for obtaining a numerical description of 1D spectra was discussed in conjunction with the isolated line model, the overlap model and the decomposition model. A combination of the single line and overlap model might fail to give a satisfactory numerical description of an observed spectral region due to missing fine structure of overlapping lines. For determination of the minimum number of overlapping lines explaining a prespecified percentage of the spectral variance, the decomposition model can be used with slight modifications. All component Lorentzian lines of the decomposition with an intensity around or below zero can be removed from the decomposition model until the minimum number of overlapping lines is found which still explains the prespecified percentage of the spectral variance.

Such a decomposition of a spectral region is well-suited for the analysis of related nD spectra but such a decomposition is only one possible solution for a normally underdetermined constraint system and shall not be taken to represent or resemble the "true" decomposition of an unresolved spectral signal.

Module "Search Task Generator":

The possible signal positions in multidimensional spectra can be derived from one-dimensional spectra. By analyzing lower-dimensional subspectra of the n-dimensional spectrum it is possible to further refine the "Search Tasks" for the n-dimensional spectrum. The "Search Task Generator" contains the rules on how possible signal positions in the nD spectrum relate to previously analyzed spectra. In case of discrepancies between signal positions in the nD spectrum and the various lower dimensional subspectra, possibly caused by coupling or possible isotope shift differences, a grid search referred to as response surface mapping can be used to overcome these uncertainties. The mapping could be extended to cover the whole spectral width in one or more dimensions which eliminates the need for a rule to derive possible signal positions in the corresponding dimensions. However, this approach is extremely compute intensive and subspectral analysis should be used whenever possible.

Modules "Single Line Analysis" and "Signal Cluster Resolution":

The real significance of the proposed nD data analysis is that the main steps of the analysis are independent of the kind of spectrum to be analyzed. The task set generated in the last analysis step specifies the spectral regions to be examined (location and mapping range) and possibly initial estimates for analysis parameters to be used. The result of the "Single Line Analysis" is stored in the database and consists of the numerical description of all identified resonances in the nD spectrum. The "Signal Cluster Resolution" module corrects these database entries for signal overlap using the overlap model. A signal in a cluster of overlapping signals with severe parameter correlations to other cluster signals is not well-determined by the data and can be removed from the cluster. Each retained signal will satisfy all prespecified parameter precision and correlation criteria.

Module "Presentation Manager":

The automated analysis of nD data is based on a parametric regression model which defines the basic building block (set of parameters) the analysis results will be described with. It is tempting to use a model of the signal pattern or patterns of interest as building block of the analysis. In the case of spectra which only contain one kind of simple signal pattern this approach is practical, conceptual simple and provides maximum detection sensitivity through the simultaneous detection of all component signals.

Most spectra such as 2D homonuclear correlation spectra (e.g., 2D COSY) contain a wide range of signal patterns. The regression analysis of a complicated coupling pattern using one regression model based on the quantum mechanical description of the spin system is possible, see Madi, Z. L. and Ernst, R. R. *Journal of Magnetic Resonance* 1988, 79, 513. However, this approach does not lend itself to automation since it requires extensive prior knowledge about the spin system under investigation and exorbitant computer resources.

When analyzing signal patterns of unknown shape or position it is preferred with the described method to detect one transition at a time (except for simultaneously fitting all transitions related by possible spectral symmetry or antisymmetry). The individual detected nD signals, after correction for mutual overlap, can be regarded as an alternative representation of the experimental data. This parametric data description is typically orders of magnitude more concise than the raw experimental data. In addition, highly efficient database query techniques can now be used to derive information from this parametric description. It is the task of the "Presentation Manager" module to derive from this parametric data description whatever information is expected from the analysis of the data. For different kinds of spectra a different kind of presentation of the results might be expected.

The basic implementation of the "Presentation Manager" could be a set of database queries with post processing of the retrieved data.

Example

An automated analysis program for 2D INADEQUATE NMR spectra based on the described design using an AB spin system model, regression analysis for detection of signals and the intensity parameter criterion for signal detection is described in Dunkel, R. et al. *Analytical Chemistry* 1992, 64, 3133–3149. The application of this automated analysis to the structure elucidation of bio-organic molecules is described in Foster, M. P. et al. *Journal of the American Chemistry Society* 1992, 114(3), 1110–1111; Dunkel, R. et al. *Analytical Chemistry* 1992, 64, 3150–3160 and Perera, P. et al. *Magnetic Resonance in Chemistry* 1993, 31, 472–480.

Figure 28A:
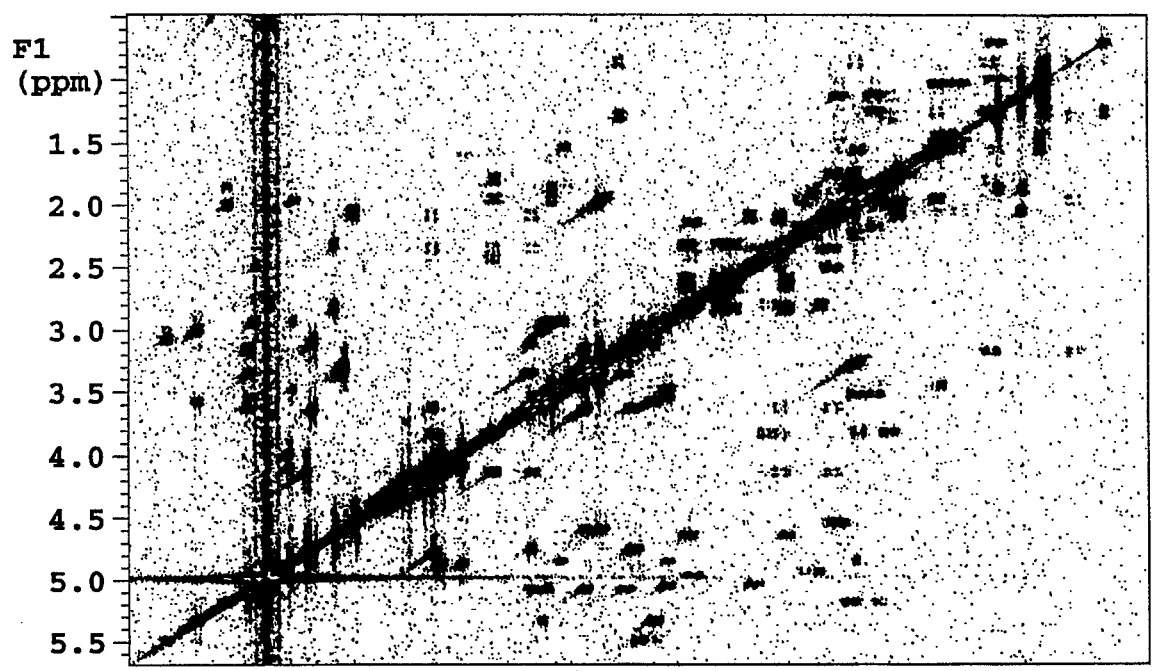
Figure 28B:
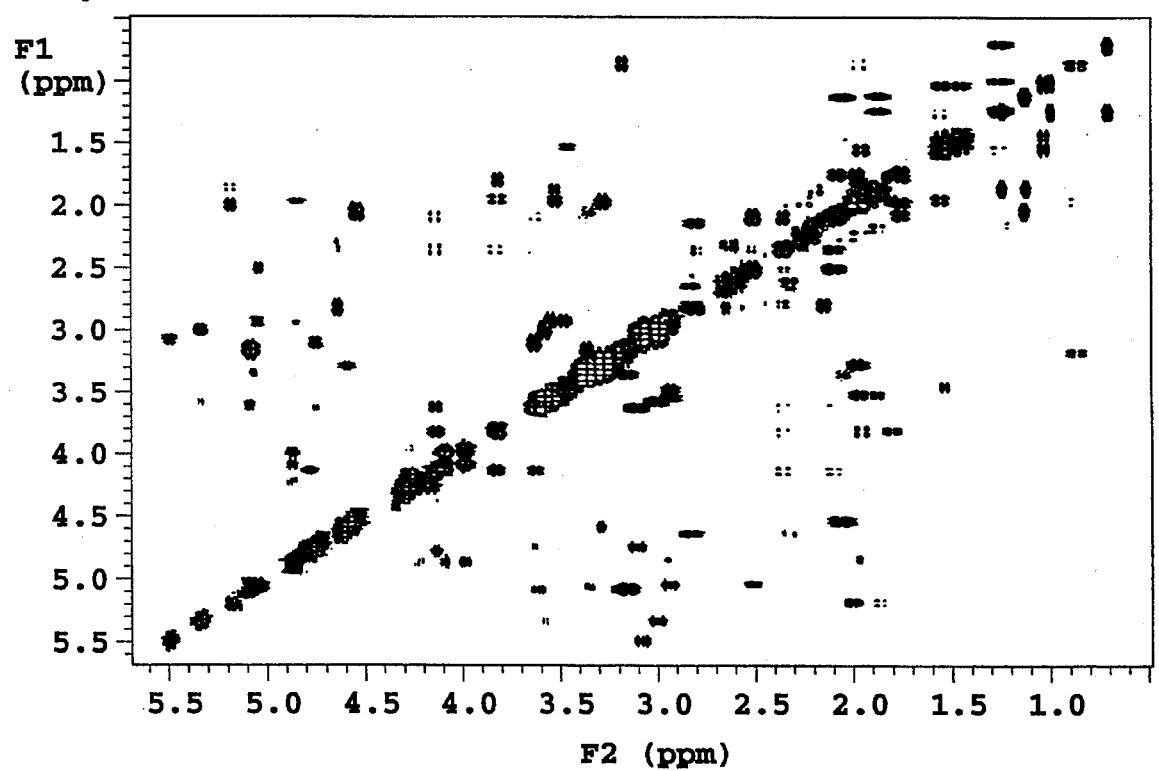

A two-dimensional DQF-COSY spectrum of conotoxin, a 22 residue peptide, a bio-organic molecule, as phase corrected by the present invention, is shown in FIG. 28a. FIG. 28b shows the corresponding simulated spectrum reconstructed from best fit parameters extracted from the experimental spectrum according to the method of the present invention.

While the bulk of the discussion above has been directed specifically towards the analysis of spectral data taken by a nuclear magnetic resonance (NMR) spectrometer, the method here disclosed is applicable to spectrometric or imaging data from other sources.

The method of the present invention is particularly useful with resonance spectrometric data including electron spin resonance (ESR) data, and Fourier transform ion cyclotron resonance mass spectrometry (FT/ICR) in addition to NMR. ESR data involves, as does NMR data, measurements of a response to a radio frequency pulse of a sample in a magnetic field, but the particle having spin that is examined is an unpaired electron. Similarly, FT/ICR data involves measurement of the response to an electromagnetic signal of a sample of ions in vacuum trapped in a magnetic field. The resonance observed in FT/ICR is at the frequency at which the ions orbit in the magnetic field, and depends on the mass to charge ratio of the ion as well as the magnitude of the magnetic field. A discussion of the elements of FT/ICR spectrometry appears in Chapter 7 of Alan G. Marshall and Francis R. Verdun, *Fourier Transforms in NMR, Optical, and Mass Spectrometry, A User's Handbook*, Elsevier, 1990.

In addition to spin and cyclotron resonances, the method disclosed is of use in the analysis of spectrometry data addressed to the observation of other resonances, including molecular vibrational resonances, including by way of example Fourier transform infrared (FT/IR) spectrometry, Fourier transform Raman (FT/RAMAN), and Fourier transform visible light spectrometry. An introduction to the elements of these forms of spectrometry is given in Chapter 9 of Alan G. Marshall and Francis R. Verdun, *Fourier*

*Transforms in NMR, Optical, and Mass Spectrometry, A User's Handbook*, Elsevier, 1990. While particularly successful in analyzing and correcting data taken by the Fourier transform forms of these types of spectrometry the method of the present invention is useful in correcting phase distortions and recognizing resonances in data, especially noisy data, taken with absorption spectrometers that do not use Fourier transform techniques. Even astronomical spectrometric data may be beneficially analyzed with the present invention. Data from NMR, ESR, ICR, Raman, visible, and IR spectrometers may be referred to as spectral data.

Imaging spectrometers, such as MRI scanners, are those spectrometers that incorporate the ability to record spatial information of resonances within a sample. The method herein disclosed is of use in correcting images for phase distortion, for movements of the sample (e.g., patient in an MRI scanner), shimming or compensating for variations in magnetic fields, and noise reduction. Use of the present invention for noise reduction has potential for reducing the time required for acquisition of acceptable images. Spectral data includes such imaging data.

Whereas this invention is here illustrated and described with reference to embodiments thereof presently contemplated as the best mode of carrying out such invention in actual practice, it is to be understood that various changes may be made in adapting the invention to different embodiments without departing from the broader inventive concepts disclosed herein and comprehended by the claims that follow.

I claim:

1. A method for correcting spectral data comprising
   a) providing a digital computing device having memory;
   b) obtaining spectral data to be corrected, said obtained spectral data including at least one signal in said obtained spectral data, and placing at least a portion of said obtained spectral data in the memory;
   c) selecting a predetermined mathematical model of expected spectral data;
   d) automatically estimating preselected model parameters of at least one signal in the obtained spectral data;
   e) adjusting the estimates of preselected parameters through regression analysis with said mathematical model to obtain adjusted estimates of the preselected parameters representing a fit of said mathematical model to the at least a portion of said obtained spectral data in memory; and
   f) determining corrected data using the adjusted estimates of at least one of the preselected parameters.

2. A method for correcting spectral data according to claim 1, wherein the mathematical model includes at least one parameter indicative of the position of a signal in the obtained data, and the at least one parameter indicative of the position of said signal is used to correct the obtained data for differences of resonance frequency between the obtained data and a reference.

3. A method for correcting spectral data according to claim 1, wherein the obtained data is obtained through a data acquisition equipment, wherein the mathematical model includes at least one parameter indicative of a position of a signal in the obtained data, and wherein the at least one parameter indicative of the position of said signal is used to correct the data acquisition equipment for positional shifts of a resonance between the obtained data and a reference.

4. A method for correcting spectral data according to claim 1, wherein the obtained data includes more than one signal, wherein preselected parameters are estimated for a plurality of signals, wherein steps c, d and e are repeated for each of the plurality of signals so that the initial estimates of preselected parameters are adjusted to obtain adjusted estimates of said parameters separately for each signal through regression analysis for each of the plurality of signals for which initial estimates of parameters have been made, and wherein the adjusted estimates of selected parameters determined for each of the plurality of signals are used in determining the corrected data.

5. A method for correcting spectral data according to claim 1, wherein the obtained data includes more than one signal, wherein preselected parameters are estimated for a plurality of signals, including after step e and before step f the additional steps of:
   g) identifying sets of overlapping signals in the plurality of signals;
   h) inserting the adjusted estimates of parameters for each of the signals in one set of overlapping signals into a predetermined overlap mathematical model of expected spectral data that takes into account the overlap of the signals;
   i) correcting the adjusted estimates of parameters for each of the signals in the set of overlapping signals for the effect of overlap through regression analysis with the overlap mathematical model; and
   j) repeating steps h and i for each additional identified set of overlapping signals to obtain corrected adjusted estimates of parameters for each of the determined overlapping signals.

6. A method for correcting spectral data according to claim 1, wherein the mathematical model represents a predefined decomposition of the data into homogeneous signal components.

7. A method for correcting spectral data according to claim 6, wherein the obtained data includes a heterogeneous signal, wherein the obtained data has a measured value at locations along the heterogeneous signal in the obtained data, wherein the mathematical model represents a predefined decomposition of the data into homogeneous signal components and there is a difference between the expected value at a location along the heterogeneous signal determined as the sum of the components of homogeneous signals at that location and the measured value of the data at that location, and wherein the mathematical model includes a set of equations, each equation defining the difference between an expected value at a location along the heterogeneous signal determined as the sum of components of homogeneous signals at that location and the measured value of the data at that location.

8. A method for correcting spectral data according to claim 1, wherein parameters are obtained for a plurality of data regions, and including the additional steps between steps d and e of determining which data regions contain signals; and removing the model parameters for regions which do not contain signals.

9. A machine for correcting magnetic resonance spectral data or optical spectral data comprising a digital computing device having memory; where the digital computing device is configured to perform the steps of:
   a) obtaining spectral data to be corrected, said obtained data including at least one signal in said obtained spectral data, and placing at least a portion of said obtained spectral data in the memory;
   b) selecting a predetermined mathematical model of expected spectral data;
   c) estimating preselected model parameters of at least one signal in the obtained data;

d) adjusting the estimates of preselected parameters through regression analysis with said mathematical model to obtain adjusted estimates of the preselected parameters representing a fit of said mathematical model to the at least a portion of said obtained spectral data in memory; and e) determining corrected data using at least one of the adjusted estimates of at least one of the preselected parameters for which adjusted estimates were obtained.

10. A machine for acquiring and correcting nuclear magnetic resonance spectral data, electron spin resonance, or ion cyclotron resonance spectral data comprising:

1) at least one magnet for generating a magnetic field;

2) at least one source of pulsed radio frequency energy;

3) a detector for measuring a time domain response of an experimental sample subjected to at least one pulse of the pulsed radio frequency energy and subjected to the magnetic field;

4) data acquisition equipment for creating a series of digitized values corresponding to the value of the time domain response of the experimental sample at discrete time intervals; and 5) a digital computing device having memory and configured to perform the steps of:

a) placing the series of digitized values in memory, b) performing a Fourier transform upon the digitized values in memory to obtain frequency domain spectral data, and retaining at least a portion of the obtained spectral data in the memory, c) selecting a predetermined mathematical model of expected spectral data, d) estimating preselected parameters of at least one signal in at least a portion of the obtained spectral data in memory, e) adjusting the estimates of preselected parameters through regression analysis with said mathematical model to obtain adjusted estimates of the preselected parameters representing a fit of said mathematical model to at least a portion of the obtained data in memory, and f) determining corrected spectral data using the adjusted estimates of at least one of the preselected parameters for which adjusted estimates were obtained.

11. A method for correcting spectral and imaging data according to claim 10, further comprising:

comparing multiple spectra taken at different times to indicate the degree of sample saturation; and adjusting a parameter of the source of pulsed radio frequency energy selected from the group consisting of a pulse shape, a pulse rate, a pulse frequency, and a pulse amplitude to control the amount of sample saturation.

12. A method for correcting spectral and imaging data according to claim 10, wherein the mathematical model includes parameters indicative of a position of a signal in the data, and wherein the parameter indicative of the position of said signal is used to adjust a parameter of the machine selected from the group consisting of a parameter of the at least one magnet, a transmitter offset, and a parameter of the at least one source of pulsed radio frequency energy.

13. A method for analyzing spectral data comprising the steps of:

a) obtaining spectral data to be analyzed, where said spectral data originates in a device selected from the group consisting of a nuclear magnetic resonance device, an ion cyclotron mass device, an optical spectrometer, an infrared spectrometer, and an electron spin resonance device;

b) estimating preselected parameters of the obtained data;

c) inserting relevant estimated preselected parameters for the obtained data into a predetermined mathematical model of expected spectral data;

d) adjusting the estimates of preselected parameters through regression analysis with said mathematical model to obtain adjusted estimates of the preselected parameters representing a fit of said mathematical model to the obtained data;

e) obtaining an error value for at least one of the preselected parameters;

f) determining a ratio of a preselected parameter and an error value of a parameter selected from the group consisting of the error value preselected parameter and a parameter correlated with the error value of the preselected parameter, such ratio having a value and the value of such ratio being an indication of whether a signal containing useful information is present in the obtained data; and g) using the adjusted parameters as information about the obtained data if the ratio of step f indicates a signal is present in the obtained data.

14. A method for analyzing spectral data according to claim 13, wherein the error value obtained for a preselected parameter is a marginal standard deviation of that parameter.

15. A method for analyzing spectral data according to claim 13, wherein the ratio of a preselected parameter and the error value is a ratio of the parameter to its error value.

16. A method for analyzing spectral data according to claim 13, wherein the ratio of a preselected parameter and the error value is a ratio of parameter error value to the parameter value itself.

17. A method for analyzing spectral data comprising the steps of:

a) obtaining spectral data to be analyzed, where said spectral data originates in a device selected from the group consisting of a nuclear magnetic resonance device, an ion cyclotron mass device, an optical spectrometer, an infrared spectrometer, and an electron spin resonance device, and placing at least a portion of said obtained spectral data in memory;

b) selecting a mathematical model of overlapping signals in the obtained data in memory;

c) estimating preselected model parameters of at least two signals in the obtained data in memory;

d) adjusting the estimates of preselected parameters through regression analysis with said mathematical model to obtain adjusted estimates of the preselected parameters representing a fit of said mathematical model to the obtained data;

e) obtaining an error value for at least one of the preselected parameters;

f) determining a ratio of a preselected parameter and an error value of a parameter selected from the group consisting of the error value preselected parameter and a parameter correlated with the error value of the preselected parameter, such ratio having a value and the value of such ratio being an indication of whether a signal containing useful information is present in the obtained data; and g) using the adjusted parameters as information about the obtained data if the ratio of step f indicates a signal is present in the obtained data.

18. A method for analyzing spectral data according to claim 17 wherein each parameter has a correlation coefficient to each other parameter, and including the step of determining for each signal in a set of overlapping signals if an absolute value of the correlation coefficient of a parameter of that signal is above a preset level, and, if so, removing the model parameters of that signal.

19. A method for analyzing spectral data according to claim 13, wherein the mathematical model represents a predefined decomposition of the data into homogeneous signal components.

20. A method for analyzing spectral data according to claim 19, wherein the obtained data includes a heterogeneous signal, wherein the obtained data has a measured value at locations along the heterogeneous signal in the obtained data, wherein the mathematical model represents a predefined decomposition of the data into homogeneous signal components and there is a difference between the expected value at a location along the heterogeneous signal determined as the sum of the components of homogeneous signals at that location and the measured value of the data at that location, and wherein the mathematical model includes a set of equations, each equation defining the difference between an expected value at a location along the heterogeneous signal determined as the sum of components of homogeneous signals at that location and the measured value of the data at that location.

21. A method for analyzing spectral data according to claim 13, wherein signal detection probabilities are determined from distributions of parameter and error value ratios determined by Monte Carlo simulation.

22. A method for analyzing spectral data according to claim 10, wherein the data to be analyzed is multi-dimensional and wherein the step of estimating preselected parameters for the data includes analyzing subdimensional data to estimate the parameters.

23. A method for analyzing spectral data according to claim 22, wherein the step of analyzing subdimensional data includes determining the presence of signals in the subdimensional data, deriving possible signal positions for the multidimensional data, and estimating preselected parameters for the multidimensional data from the determined subdimensional data parameters.

24. The method of claim 1, wherein the preselected model parameters include parameters corresponding to baseline correction and a parameter corresponding to phase correction.

25. The method of claim 1, wherein the spectral data comprises multidimensional spectral data, and wherein the step of estimating preselected model parameters for at least a second spectrum in the multidimensional spectral data is based upon an analysis of spectral data for a first spectrum in the multidimensional spectral data.

26. The method of claim 25, wherein the first spectrum corresponds to a one dimensional spectrum.

27. The method of claim 1, wherein the step of adjusting the estimates of preselected model parameters further comprises the steps of:

decomposing the spectral data into at least two sections of a spectrum; and adjusting by regression analysis, separately for each of the at least two sections of a spectrum, the estimates of preselected model parameters corresponding to the spectral data for each section of the spectrum.

28. The method of claim 27, wherein the step of adjusting the estimates of preselected model parameters further comprises the steps of:

combining the adjusted estimates of preselected model parameters corresponding to the spectral data for each section of the spectrum into a composite set of adjusted parameters; and refining by regression analysis the composite set of adjusted parameters.

29. The method of claim 1, wherein the step of adjusting the estimates of preselected model parameters further comprises the steps of:

adjusting estimates of preselected model parameters of a single line model by regression analysis with the single line model for at least a portion of the spectral data;

applying the adjusted estimates of preselected model parameters from the single line model to an overlap model, and further refining estimates of preselected model parameters by regression analysis with the overlap model for at least a portion of the spectral data; and determining whether the overlap model represents a better fit to the spectral data than the single line model.

* * * * *